(12) United States Patent
Ikedo

(10) Patent No.: US 9,755,000 B2
(45) Date of Patent: Sep. 5, 2017

(54) MEMORY DEVICE

(71) Applicant: Toshiba Memory Corporation, Tokyo (JP)

(72) Inventor: Akihito Ikedo, Yokkaichi Mie (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 14/839,874

(22) Filed: Aug. 28, 2015

(65) Prior Publication Data

US 2016/0293841 A1    Oct. 6, 2016

(30) Foreign Application Priority Data

Mar. 30, 2015  (JP) ................................. 2015-070396

(51) Int. Cl.

| G11C 8/12 | (2006.01) |
|---|---|
| H01L 27/24 | (2006.01) |
| H01L 23/522 | (2006.01) |
| H01L 45/00 | (2006.01) |

(52) U.S. Cl.
CPC ...... *H01L 27/2481* (2013.01); *H01L 23/5226* (2013.01); *H01L 45/1233* (2013.01)

(58) Field of Classification Search
CPC ............ G11C 13/0007; G11C 13/0023; G11C 13/0004; G11C 13/0014; G11C 13/025; H01L 21/76838; H01L 21/76897; H01L 23/5226; H01L 23/528; H01L 27/2481; H01L 27/2409; H01L 23/52; H01L 45/085

USPC ................. 365/148; 257/4, 211, 5, 774, 314
See application file for complete search history.

(56) References Cited

U.S. PATENT DOCUMENTS

| 2007/0132049 A1 | 6/2007 | Stipe |
|---|---|---|
| 2010/0187591 A1 | 7/2010 | Nagashima |
| 2011/0204309 A1 | 8/2011 | Nitta |
| 2013/0249113 A1 | 9/2013 | Baba |
| 2014/0021427 A1* | 1/2014 | Ishibashi ........... H01L 21/76805 257/1 |
| 2014/0104968 A1 | 4/2014 | Flores et al. |

FOREIGN PATENT DOCUMENTS

JP    2009283514 A    12/2009

* cited by examiner

*Primary Examiner* — David Vu
*Assistant Examiner* — Mouloucoulaye Inoussa
(74) *Attorney, Agent, or Firm* — Patterson & Sheridan, LLP

(57) ABSTRACT

A memory device includes a substrate, a first conductive layer above the substrate and extending in a first direction parallel to a surface of the substrate, a second conductive layer above the first conductive layer and extending in the first direction, wherein centers of the first and second conductive layers are aligned in a second direction that is substantially perpendicular to the surface of the substrate, and a contact extending in the second direction from a position lower than the first conductive layer to a position higher than the second conductive layer, the contact being electrically connected to and in direct contact with the first conductive layer and electrically insulated and physically separated from the second conductive layer.

19 Claims, 22 Drawing Sheets

FIG. 9A   FIG. 9B   FIG. 9C
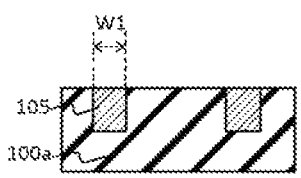  
FIG. 10
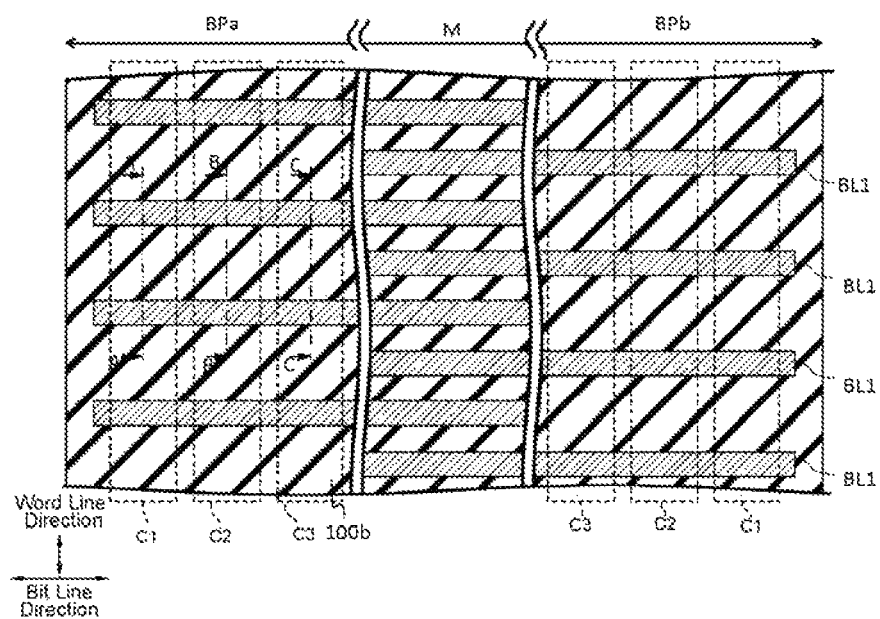

*FIG. 11A*   *FIG. 11B*   *FIG. 11C*
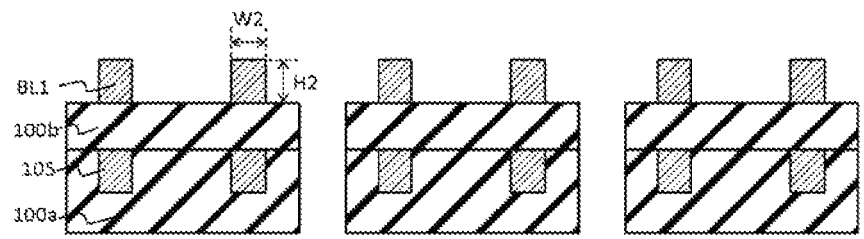
*FIG. 12*
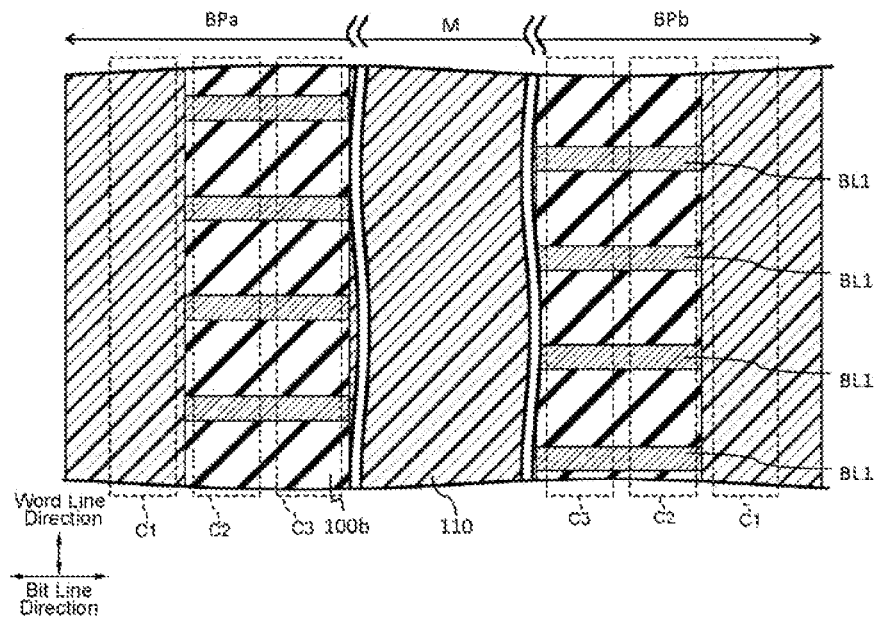

MEMORY DEVICE

CROSS-REFERENCE TO RELATED APPLICATION

This application is based upon and claims the benefit of priority from Japanese Patent Application No. 2015-070396, filed Mar. 30, 2015, the entire contents of which are incorporated herein by reference.

FIELD

Exemplary embodiments described herein relate to a memory device.

BACKGROUND

In recent years, semiconductor memory devices have become more highly integrated. One example is a three-dimensional memory device. One type of a three-dimensional memory device is a three-dimensional stacked cross-point type memory device.

DESCRIPTION OF THE DRAWINGS

FIG. 5A is a cross-sectional view taken along line A-A' of FIG. 4, FIG. 5B is a cross-sectional view taken along line B-B', and FIG. 5C is a cross-sectional view taken along line C-C'.

FIGS. 9A to 9C are schematic cross-sectional views illustrating a step of a method of manufacturing the memory device according to the first embodiment.

FIG. 10 is a schematic plan view illustrating a step of the method of manufacturing the memory device according to the first embodiment.

FIGS. 11A to 11C are schematic cross-sectional views illustrating a step of the method of manufacturing the memory device according to the first embodiment; FIG. 11A is a cross-sectional view taken along line A-A' of FIG. 10, FIG. 11B is a cross-sectional view taken along line B-B', and FIG. 11C is a cross-sectional view taken along line C-C'.

FIG. 12 is a schematic plan view illustrating a step of the method of manufacturing the memory device according to the first embodiment.

FIG. 14A is a cross-sectional view taken along line A-A' of FIG. 13, FIG. 14B is a cross-sectional view taken along line B-B', and FIG. 14C is a cross-sectional view taken along line C-C'.

FIG. 16A is a cross-sectional view taken along line A-A' of FIG. 15, FIG. 16B is a cross-sectional view taken along line B-B', and FIG. 16C is a cross-sectional view taken along line C-C'.

FIG. 19A is a cross-sectional view taken along line A-A' of FIG. 18, FIG. 19B is a cross-sectional view taken along line B-B', and FIG. 19C is a cross-sectional view taken along line C-C'.

FIG. 21A is a cross-sectional view taken along line A-A' of FIG. 20, FIG. 21B is a cross-sectional view taken along line B-B', and FIG. 21C is a cross-sectional view taken along line C-C'.

FIG. 24A is a cross-sectional view taken along line A-A' of FIG. 23, FIG. 24B is a cross-sectional view taken along line B-B', and FIG. 24C is a cross-sectional view taken along line C-C'.

FIG. 25A is a cross-sectional view taken along line A-A' of FIG. 23, FIG. 25B is a cross-sectional view taken along line B-B', and FIG. 25C is a cross-sectional view taken along line C-C'.

FIG. 28A is a cross-sectional view taken along line A-A' of FIG. 27, FIG. 28B is a cross-sectional view taken along line B-B', and FIG. 28C is a cross-sectional view taken along line C-C'.

FIG. 29A is a cross-sectional view equivalent to a position taken along line A-A' of FIG. 27, FIG. 29B is a cross-sectional view equivalent to a position taken along line B-B', FIG. 29C is a cross-sectional view equivalent to a position taken along line C-C'.

FIG. 31A is a cross-sectional view taken along line A-A' of FIG. 30, FIG. 31B is a cross-sectional view taken along line B-B', and FIG. 31C is a cross-sectional view taken along line C-C'.

FIG. 34A is a cross-sectional view taken along line A-A' of FIG. 33, FIG. 34B is a cross-sectional view taken along line B-B', and FIG. 34C is a cross-sectional view taken along line C-C'.

FIG. 36A is a cross-sectional view equivalent to that taken along line A-A' of FIG. 4, FIG. 36B is a cross-sectional view equivalent to that taken along line B-B', and FIG. 36C is a cross-sectional view equivalent to that taken along line C-C'.

DETAILED DESCRIPTION

Figure 1:
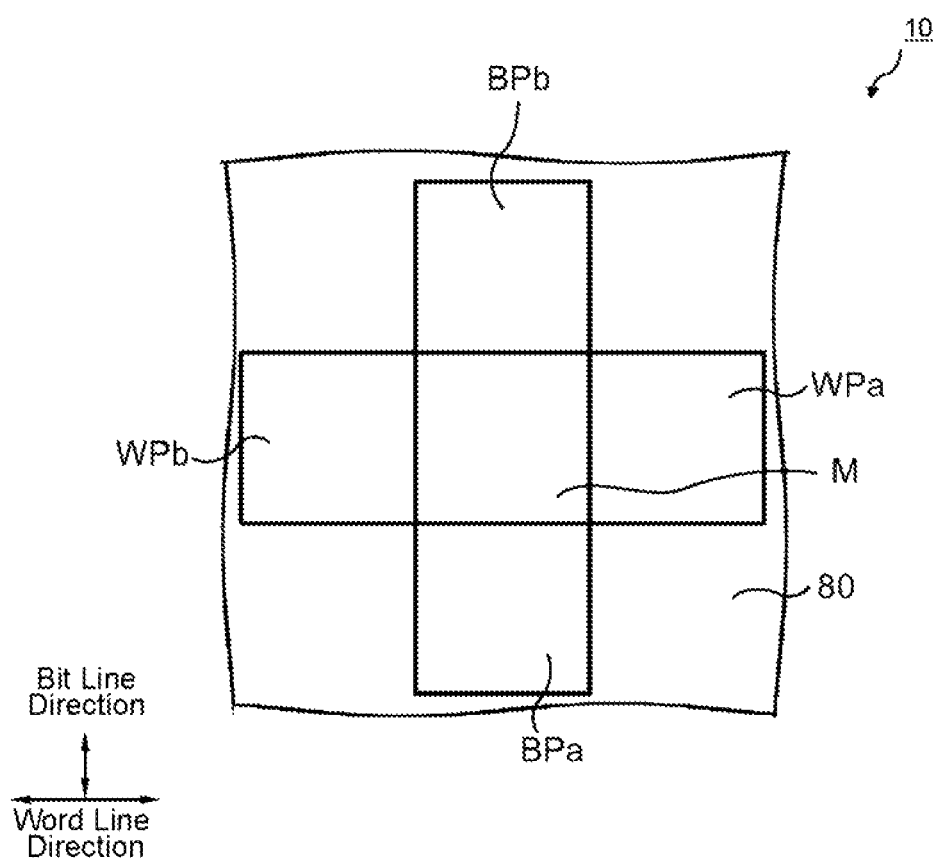
FIG. 1 is a plan view of a memory cell array of a memory device according to a first embodiment.

Embodiments provide a low-cost memory device having a reduced size.

In general, according to one embodiment, a memory device includes a substrate, a first conductive layer above the substrate and extending in a first direction parallel to a surface of the substrate, a second conductive layer above the first conductive layer and extending in the first direction, centers of the first and second conductive layers are aligned in a second direction that is substantially perpendicular to the surface of the substrate, and a contact extending in the second direction from a position lower than the first conductive layer to a position higher than the second conductive layer, the contact being electrically connected to and in direct contact with the first conductive layer and electrically insulated and physically separated from the second conductive layer.

Hereinafter, embodiments will be described with reference to the accompanying drawings. In the following description, substantially the same functions and components are denoted by the same reference numerals and signs.

Hereinafter, exemplary embodiments described herein will be described with reference to the accompanying drawings.

First Embodiment

FIG. 1 is a plan view schematically illustrating the entirety of a memory cell array 10 of a memory device according to a first embodiment.

As shown in FIG. 1, the memory cell array 10 is provided with a semiconductor substrate (for example, silicon substrate) 80. On the upper-layer portion or the lower-layer portion of the semiconductor substrate 80, for example, peripheral circuits (not shown) are formed.

Above the semiconductor substrate 80, for example, a rectangular memory portion M is provided when the semiconductor substrate 80 is viewed from above. As viewed from the memory portion M, both sides in a word line direction are provided with word line contact regions WPa and WPb at two locations. In addition, as viewed from the memory portion M, both sides in a bit line direction are provided with bit line contact regions BPa and BPb at two locations.

Figure 2:
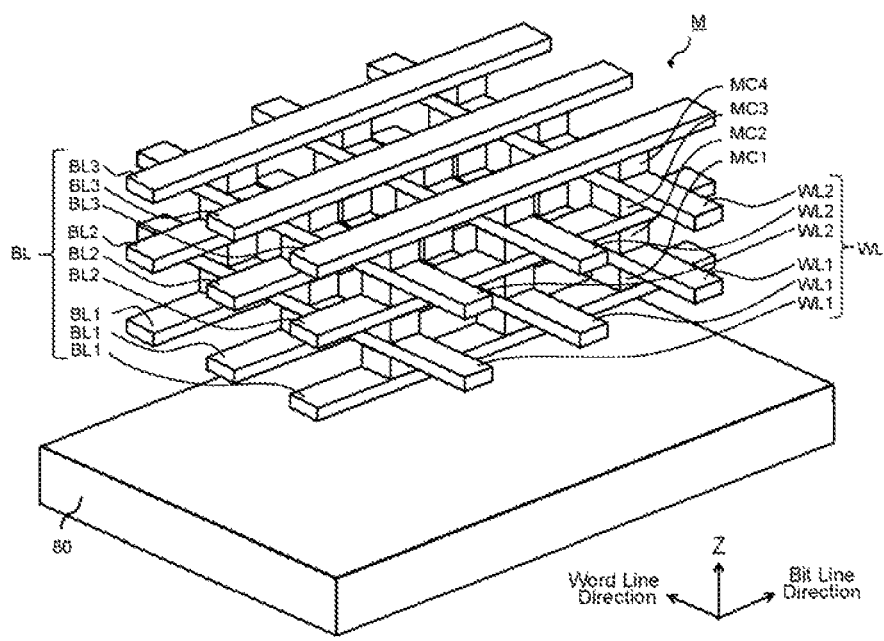
FIG. 2 is a perspective view illustrating a schematic configuration of a memory portion of the memory device according to the first embodiment.

As shown in FIG. 2, the memory portion M includes a bit line BL, a word line WL, and a memory portion MC.

The bit line BL and the word line WL are arranged on the semiconductor substrate 80. A first bit line BL1, a first word line WL1, a second bit line BL2, a second word line WL2, and a third bit line BL3 are arranged in order from the semiconductor substrate 80 side. Meanwhile, when these lines are not required to be distinguished from each other, the first bit line BL1, the second bit line BL2, and the third bit line BL3 are referred to as the bit line BL, and the first word line WL1 and the second word line WL2 are referred to as the word line WL.

The extending direction of the word line WL is referred to as a "word line direction", and the extending direction of the bit line BL is referred to as a "bit line direction". In addition, a direction perpendicular to the upper surface of the semiconductor substrate 80 is referred to as a "Z direction".

The memory cell MC is formed between the bit line and the word line. For example, a memory cell MC1 is formed between the first bit line BL1 and the first word line WL1, a memory cell MC2 is formed between the first word line WL1 and the second bit line BL2, a memory cell MC3 is formed between the second bit line BL2 and the second word line WL2, and a memory cell MC4 is formed between the second word line WL2 and the third bit line BL3. In addition, when the memory cells MC1, MC2, MC3, and MC4 are not distinguished from each other, these memory cells are simply referred to as the memory cell MC.

Figure 3:
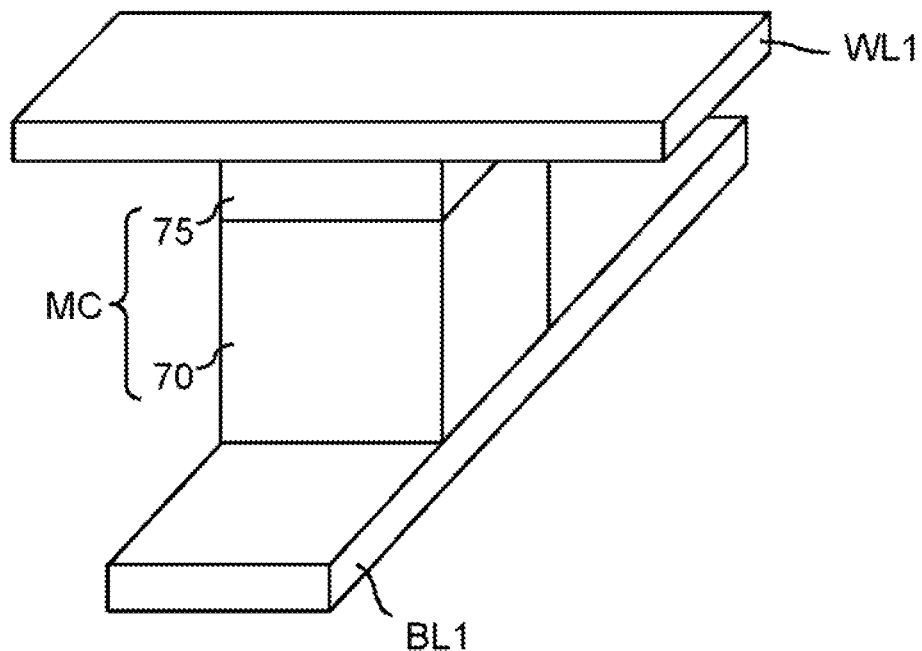
FIG. 3 is a perspective view illustrating a schematic configuration of a memory cell of the memory device according to the first embodiment.

As shown in FIG. 3, the memory cell MC includes, for example, an element selection layer 70 and a variable resistance layer 75 provided thereon.

The element selection layer 70 is a layer for rectifying the amount of current flowing to the memory cell MC. The element selection layer 70 is, for example, silicon.

The variable resistance layer 75 is, for example, a layer made of a metal oxide, in which when a voltage is applied, a filament is formed therein and its electric resistance value is reduced, and when a voltage is applied again, the filament is contracted and its electric resistance value increases. That is, a low resistance state for the electric resistance value of the variable resistance layer 75 is set as "0" and a high resistance state therefor is set as "1", thereby allowing, for example, binary data to be stored in the memory cell MC. Naturally, the low resistance state may be set as "1", and the high resistance state may be set as "0".

Meanwhile, as the memory cell MC, memory cells of various memories such as a resistive random access memory (ReRAM), a phase change random access memory (PCRAM), and a magneto-resistive random access memory (MRAM) may be used among others.

A bit line contact 165 according to the first embodiment will be described with reference to FIGS. 4 to 8.

Figure 4:
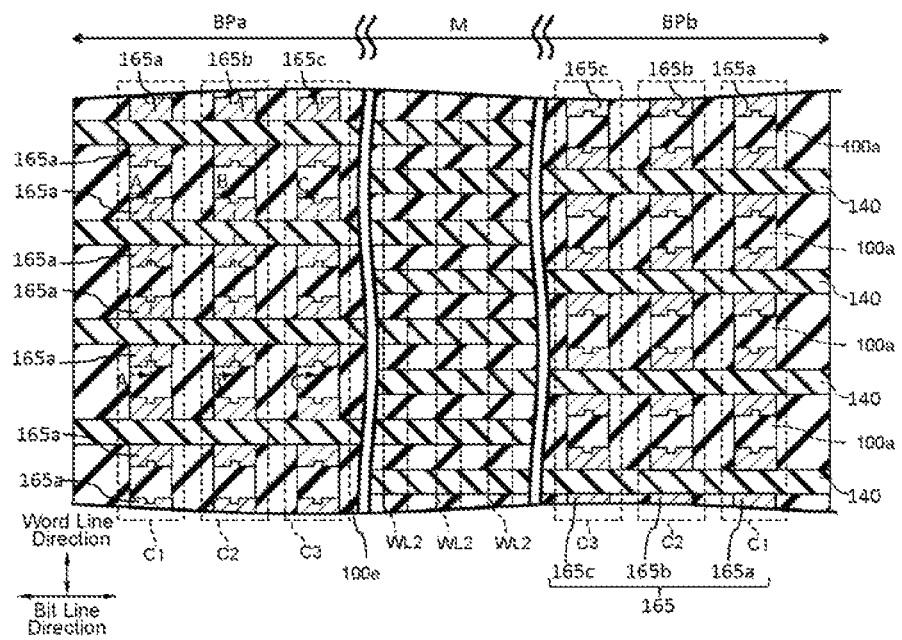
FIG. 4 is a schematic plan view of a memory portion and bit line contact regions of the memory device according to the first embodiment.

The bit line contact 165 according to the first embodiment will be described with reference to FIG. 4. FIG. 4 is a schematic plan view illustrating the memory portion M and the bit line contact regions BPa and BPb. Meanwhile, in FIG. 4, the description of a sixth insulating layer 190 (shown in FIGS. 5A, 5B, and 5C) is not given for the sake of convenience, and the profile of the second word line WL2 is shown by a broken line.

The memory portion M is provided with the second word line WL2 and a cap layer 140. The bit line contact region BPa or BPb is provided with the cap layer 140.

The second word line WL2 extends in the word line direction.

The cap layer 140 extends in the bit line direction. As described later, the first bit line BL1, the second bit line BL2, and the third bit line BL3 which are not shown are arranged below the cap layer 140 so as to substantially overlap each other when viewed from above. In the memory portion M, the bit line BL and the word line WL intersect each other. As described in FIG. 2, the memory cell MC (not shown) is arranged at an intersecting portion between the bit line BL and the word line WL.

The cap layer 140 and the bit line BL (not shown) are, for example, alternately arranged at the bit line contact region BPa or BPb.

The bit line contact region BPa or BPb includes a first contact region C1, a second contact region C2, and a third contact region C3. When the first contact region C1, the second contact region C2, and the third contact region C3 are not distinguished from each other, these regions are simply referred to as a contact region C.

The first contact region C1 includes a first bit line contact 165a that connects the first bit line BL1 and a lower-layer wiring (not shown). The second contact region C2 includes a second bit line contact 165b that connects the second bit line BL2 and a lower-layer wiring (not shown). The third contact region C3 includes a third bit line contact 165c that connects the third bit line BL3 and a lower-layer wiring (not shown). Meanwhile, when the first bit line contact 165a, the second bit line contact 165b, and the third bit line contact 165c are not distinguished from each other, these contacts are simply referred to as the bit line contact 165.

The bit line contact 165 is arranged at the bit line contact regions BPa and BPb. The bit line contact 165 is arranged so as to come into contact with both lateral sides in the extending direction of the cap layer 140. In other words, the bit line contact 165 is arranged so as to come into contact with the cap layer 140 in the word line direction.

Hereinafter, the cross-section structure of the bit line contact 165 will be described with reference to FIG. 5.

Figure 5A:
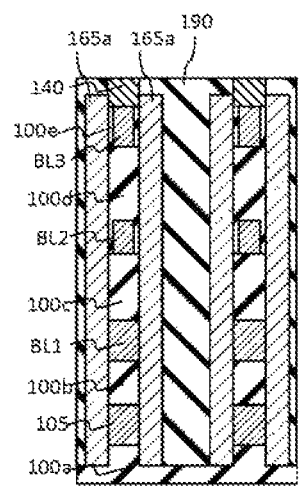
FIGS. 5A to 5C are schematic cross-sectional views of bit line contacts of the memory device according to the first embodiment.
Figure 5B:
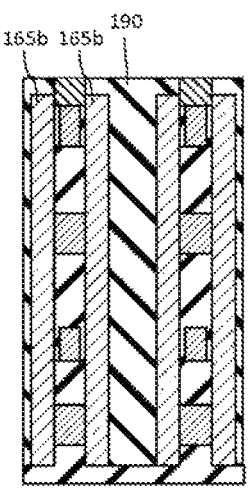
Figure 5C:
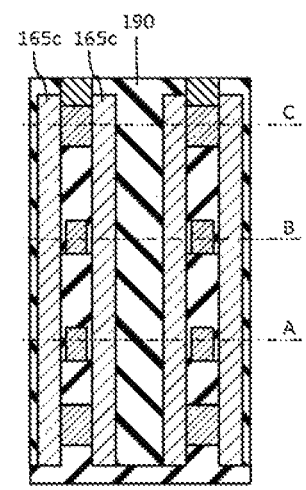

FIG. 5A is a cross-sectional view taken along line A-A' of FIG. 4, and shows a schematic cross-section of the first bit line contact 165a. Similarly, FIG. 5B is a cross-sectional view taken along line B-B' of FIG. 4, and shows a schematic cross-section of the second bit line contact 165b. FIG. 5C is a cross-sectional view taken along line C-C' of FIG. 4, and shows a schematic cross-section of the third bit line contact 165c.

As shown in FIG. 5A, a lower-layer wiring 105, a second insulating layer 100b, the first bit line BL1, a third insulating layer 100c, the second bit line BL2, a fourth insulating layer 100d, the third bit line BL3, and the cap layer 140 are provided in that order on a first insulating layer 100a. The first bit line contact 165a is provided on both sides of these layers in the word line direction. In addition, the sixth insulating layer 190 is arranged so as to cover the first bit line contacts 165a that are next to each other and are provided on different first bit lines, and the upper portions thereof.

As shown in FIG. 5A, the lower-layer wiring 105, the first bit line BL1, and the cap layer 140 have substantially the same width. On the other hand, the widths of the second bit line BL2 and the third bit line BL3 are smaller. The term "width" as used herein refers to the length of the bit line BL in the word line direction.

The first bit line contact 165a extends in a direction intersecting the semiconductor substrate, for example, the Z direction. The first bit line contact 165a is arranged so as to come into contact with both lateral sides of the lower-layer wiring 105, the first bit line BL1, and the cap layer 140. That is, the first bit line contact 165a is electrically connected to the lower-layer wiring 105 and the first bit line BL1.

Meanwhile, since the first bit line contact 165a has a manufacturing variation, the extending directions of the respective first bit line contacts 165a are necessarily parallel. That is, the extending directions of the first bit line contacts 165a may be slightly different.

Each of the second bit lines BL2 includes the fourth insulating layer 100d on two lateral sides thereof. That is, the fourth insulating layer 100d is arranged between the second bit line BL2 and the first bit line contact 165a. That is, the second bit line BL2 does not physically come into contact with the first bit line contact 165a. Meanwhile, the fourth insulating layer 100d is also arranged above the second bit line BL2, and covers the upper surface and the lateral side of the second bit line BL2.

Each of the third bit lines BL3 also includes a fifth insulating layer 100e on two lateral sides thereof. That is, the fifth insulating layer 100e is arranged between the third bit line BL3 and the first bit line contact 165a. Similarly to the second bit line BL2, the third bit line BL3 and the first bit line contact 165a do not physically come into contact with each other.

In a region in which the second bit line contact 165b shown in FIG. 5B is formed, the lower-layer wiring 105, the second bit line BL2, and the cap layer 140 have substantially the same width, whereas the widths of the first bit line BL1 and the third bit line BL3 are smaller.

The second bit line contact 165b extends in a direction substantially perpendicular to the semiconductor substrate. The second bit line contact 165b is arranged so as to come into contact with the lateral sides of the lower-layer wiring 105, the second bit line BL2, and the cap layer 140. That is, the second bit line contact 165b is electrically connected to the lower-layer wiring 105 and the second bit line BL2.

The third insulating layer 100c is arranged between the first bit line BL1 and the second bit line contact 165b. In addition, the fifth insulating layer 100e is arranged between the third bit line BL3 and the second bit line contact 165b. That is, the first bit line BL1 and the third bit line BL3 do not physically come into contact with the second bit line contact 165b.

In a region in which the third bit line contact 165c shown in FIG. 5C is formed, the lower-layer wiring 105, the third bit line BL3, and the cap layer 140 have substantially the same width, whereas the widths of the first bit line BL1 and the second bit line BL2 are smaller.

The third bit line contact 165c extends in a direction substantially perpendicular to the semiconductor substrate. The third bit line contact 165c is arranged so as to come into contact with the lateral sides of the lower-layer wiring 105, the third bit line BL3, and the cap layer 140. That is, the third bit line contact 165c is electrically connected to the lower-layer wiring 105 and the third bit line BL3.

The third insulating layer 100c is arranged between the first bit line BL1 and the third bit line contact 165c. In addition, the fourth insulating layer 100d is arranged between the second bit line BL2 and the third bit line contact 165c. That is, the first bit line BL1 and the second bit line BL2 do not physically come into contact with the third bit line contact 165c. Meanwhile, the third insulating layer 100c is also arranged above the first bit line BL1, and covers the upper surface and the lateral side of the first bit line BL1. In addition, the fourth insulating layer 100d is also arranged above the second bit line BL2, and covers the upper surface and the lateral side of the second bit line BL2.

That is, in summary, the first bit line contact 165a comes into contact with the first bit line BL1 and the lower-layer wiring 105, and is electrically connected thereto. The second bit line contact 165b comes into contact with the second bit line BL2 and the lower-layer wiring 105, and is electrically connected thereto. The third bit line contact 165c comes into contact with the third bit line BL3 and the lower-layer wiring 105, and is electrically connected thereto.

Figure 6:
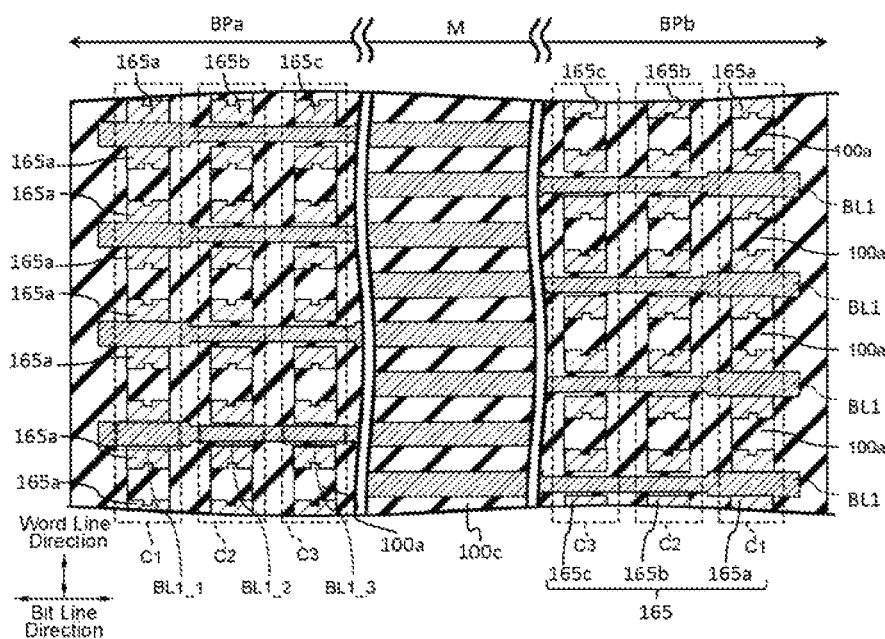
FIG. 6 is a schematic plan view illustrating a relationship between a bit line and the bit line contacts in the memory portion and the bit line contact regions of the memory device according to the first embodiment.
Figure 7:
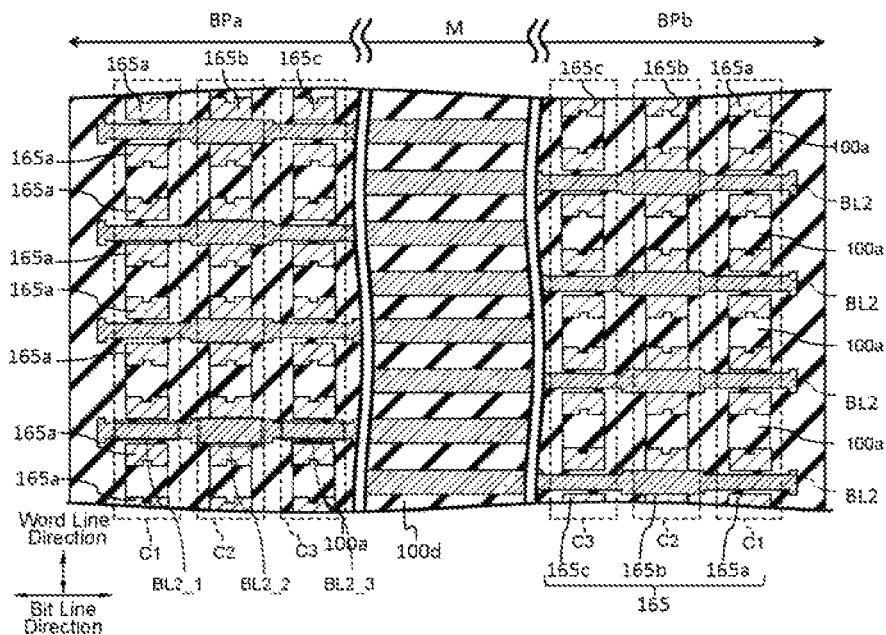
FIG. 7 is a schematic plan view illustrating a relationship between a bit line and the bit line contacts in the memory portion and the bit line contact regions of the memory device according to the first embodiment.
Figure 8:
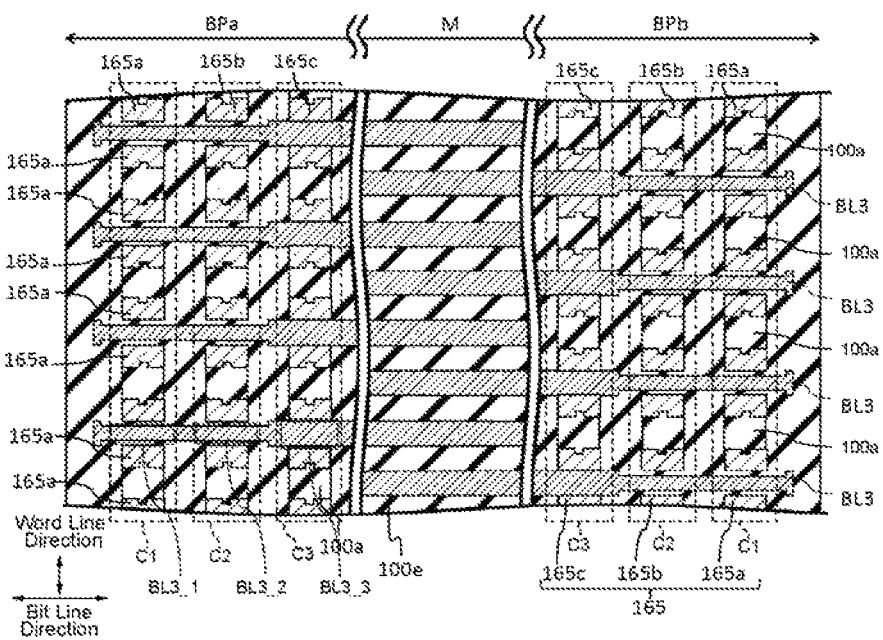
FIG. 8 is a schematic plan view illustrating a relationship between a bit line and the bit line contacts in the memory portion and the bit line contact regions of the memory device according to the first embodiment.
Figure 13:
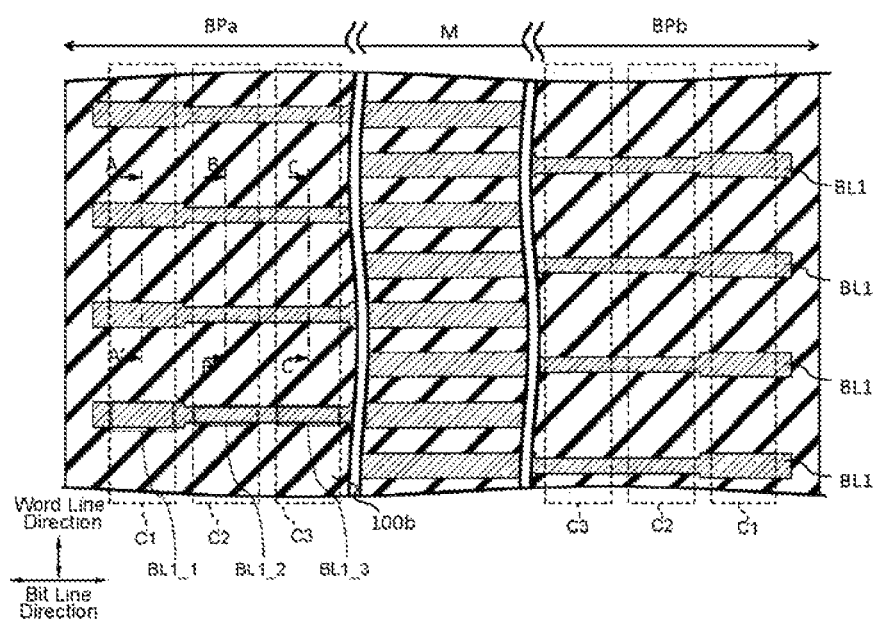
FIG. 13 is a schematic plan view illustrating a step of the method of manufacturing the memory device according to the first embodiment.
Figures 14A, 14B, 14C:
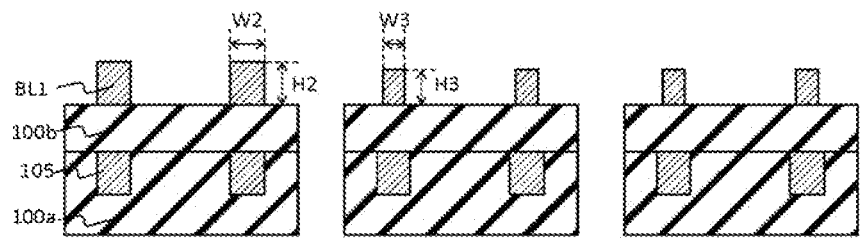
FIGS. 14A to 14C are a schematic cross-sectional views illustrating a step of the method of manufacturing the memory device according to the first embodiment.
Figure 15:
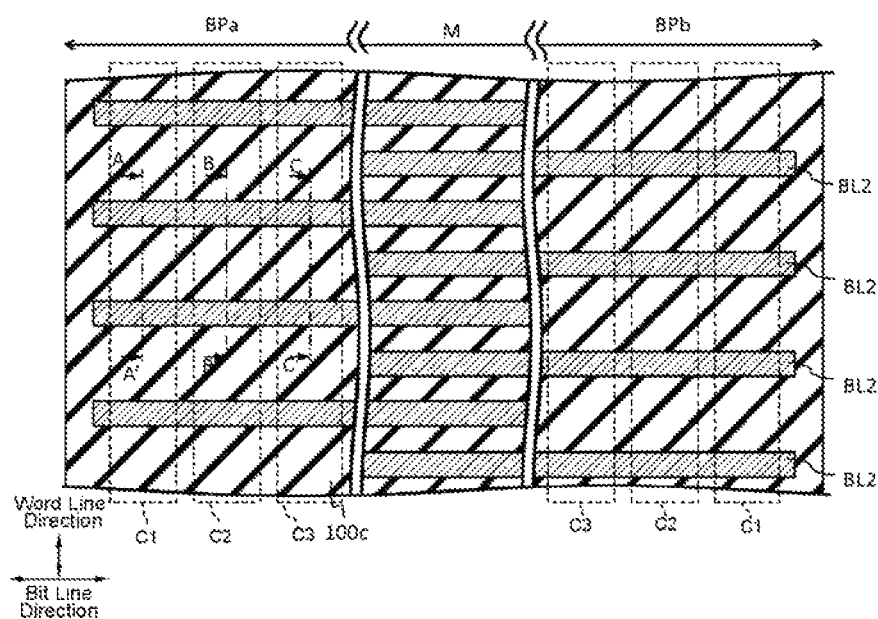
FIG. 15 is a schematic plan view illustrating a step of the method of manufacturing the memory device according to the first embodiment.
Figures 16A, 16B, 16C:
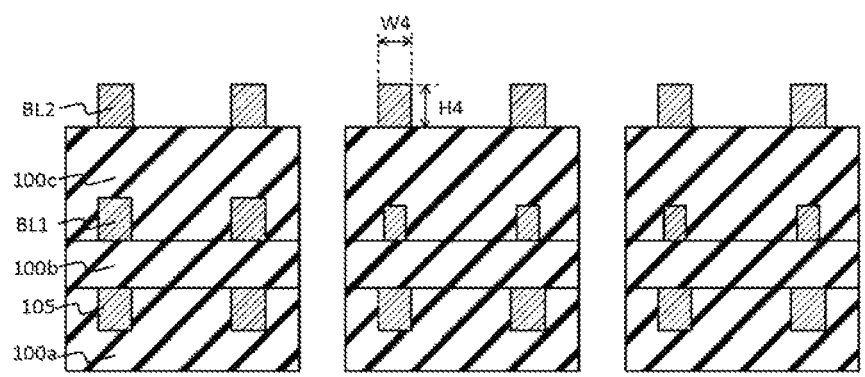
FIGS. 16A to 16C are schematic cross-sectional views illustrating a step of the method of manufacturing the memory device according to the first embodiment.

Subsequently, a positional relationship between the bit line BL and the bit line contact 165 will be described with reference to a plan view. FIG. 6 is a plan view of a section taken at a height shown by line A in FIG. 5C; FIG. 7 is a plan view of a section taken at a height shown by line B in FIG. 5C; and FIG. 8 is a plan view of a section taken at a height shown by line C in FIG. 5C. Meanwhile, in FIGS. 6 to 8, the description of the sixth insulating layer 190 is not given for the sake of convenience.

As shown in FIG. 6, the first bit line BL1 is alternately arranged at the bit line contact regions BPa and BPb in the word line direction. In the second contact region C2 and the third contact region C3, the first bit line BL1 is provided so as to be smaller in width than in the first contact region C1.

In other words, the first bit line BL1 includes a first portion BL1_1 arranged in the first contact region C1, a second portion BL1_2 arranged in the second contact region C2, and a third portion BL1_3 arranged in the third contact region C3. The second portion BL1_2 and the third portion BL1_3 are smaller in width than the first portion BL1_1.

The first bit line contact 165a, the second bit line contact 165b, and the third bit line contact 165c are provided at substantially the same position in the word line direction. In the second contact region C2 and the third contact region C3, since the width of the first bit line BL1 is small, the second bit line contact 165b and the third bit line contact 165c are arranged at positions separated from the first bit line BL1 in the width (word line) direction. That is, the second bit line contact 165b and the third bit line contact 165c do not come into contact with the first bit line BL1. Meanwhile, the width of the first bit line BL1 in the first contact region C1 may be the same as the width of the first bit line BL1 in the memory portion M.

In addition, as shown in FIG. 6, the first bit line BL1 may also be provided so as to have a width small between the second contact region C2 and the third contact region C3. The bit line is provided so as to have a small width between the contact regions C, and thus the formation of the first bit line BL1, specifically patterning using lithography or processing using RIE is facilitated.

As shown in FIG. 7, the second bit line BL2 is alternately arranged in the bit line contact regions BPa and BPb. In the first contact region C1 and the third contact region C3, the second bit line BL2 is provided so as to be smaller in width than in the second contact region C2. Meanwhile, the width of the second bit line BL2 in the second contact region C2 may be the same as the width of the second bit line BL2 in the memory portion M.

In other words, the second bit line BL2 includes a fourth portion BL2_1 arranged in the first contact region C1, a fifth portion BL2_2 arranged in the second contact region C2, and a sixth portion BL2_3 arranged in the third contact region C3. The fourth portion BL2_1 and the sixth portion BL2_3 are smaller in width than the fifth portion BL2_2.

In the first contact region C1 and the third contact region C3, since the width of the second bit line BL2 is small, the first bit line contact 165a and the third bit line contact 165c are arranged at positions separated from the second bit line BL2 in the width (word line) direction.

As shown in FIG. 8, the third bit line BL3 is alternately arranged in the bit line contact regions BPa and BPb. In the first contact region C1 and the second contact region C2, the third bit line BL3 is provided so as to be smaller in width than in the third contact region C3.

In the first contact region C1 and the second contact region C2, since the width of the third bit line BL3 is small, the first bit line contact 165a and the second bit line contact 165b are arranged at positions separated from the third bit line BL3 in the width (word line) direction.

As shown in FIG. 8, the third bit line BL3 may also be provided so as to have a small width between the first contact region C1 and the second contact region C2. The formation of the third bit line BL3 is facilitated. Meanwhile, the width of the third bit line BL3 in the third contact region C3 may be the same as the width of the second bit line BL2 in the memory portion M.

In other words, the third bit line BL3 includes a seventh portion BL3_1 arranged in the first contact region C1, an eighth portion BL3_2 arranged in the second contact region C2, and the ninth portion BL3_3 arranged in the third contact region C3. The seventh portion BL3_1 and the eighth portion BL3_2 are smaller in width than the ninth portion BL3_3.

Manufacturing Method of First Embodiment

A manufacturing method according to the first embodiment will be described with reference to FIGS. 9A to 34C.

As shown in FIGS. 9A to 9C, the first insulating layer 100a is provided above the substrate. The lower-layer wiring 105 is provided above the first insulating layer 100a.

The first insulating layer 100a is, for example, a silicon oxide layer. The lower-layer wiring 105 is, for example, a wiring which is connected to a sense amplifier or a decoder.

The lower-layer wiring 105 includes, for example, a metal layer and a barrier metal layer. The metal layer includes, for example, copper, aluminum, or tungsten. The barrier metal layer includes, for example, titanium, tantalum, a titanium nitride, a tantalum nitride, or a stacked layer thereof.

The width of the lower-layer wiring 105 is set as W1. Meanwhile, the width of the lower-layer wiring 105 refers to the length of the lower-layer wiring 105 in a direction which is orthogonal to the extending direction of the bit line BL and is parallel to the semiconductor substrate.

As shown in FIGS. 10 and 11A to 11C, the second insulating layer 100b is provided on the first insulating layer 100a. The first bit line BL1 is provided on the second insulating layer 100b.

The second insulating layer 100b is, for example, a silicon oxide layer, and is formed by, for example, a CVD (Chemical Vapor Deposition) method.

The first bit line BL1 is formed so as to extend to, for example, the memory portion M and the bit line contact region BPa or BPb. The first bit line BL1 is formed so as to be alternately extracted to, for example, the bit line contact regions BPa and BPb.

The first bit line BL1 has a width W2 and a height H2 in the contact region C.

In the contact region C, the first bit line BL1 is formed so as to substantially overlap the lower-layer wiring 105. That is, in the contact region C, the width W2 of the first bit line BL1 is substantially the same as a width W1 of the lower wiring layer.

Meanwhile, the width of the first bit line BL1 refers to the length of the first bit line in a direction which is orthogonal to the extending direction of the first bit line BL1 and is parallel to the semiconductor substrate. The height of the first bit line BL1 refers to the length of the first bit line in a direction which is orthogonal to the extending direction of the first bit line BL1 and is perpendicular to the semiconductor substrate.

The first bit line BL1 is a conductive layer, and includes, for example, a metal layer and a barrier metal layer. The metal layer includes, for example, copper, aluminum, or tungsten. The barrier metal layer includes, for example, titanium, tantalum, a titanium nitride, a tantalum nitride, or a stacked layer thereof. The first bit line BL1 has, for example, the metal layer and the barrier metal layer formed therein, and then is formed by a lithography method and an RIE method.

As shown in FIG. 12, a first mask layer 110 is formed on the first bit line BL1 and the second insulating layer 100b. The first mask layer 110 does not cover the second contact region C2 and the third contact region C3, and covers other regions. The first mask layer 110 covers, for example, the first contact region C1 and the memory portion M. The first mask layer 110 is, for example, a resist material, and is formed by lithography.

As shown in FIGS. 13 and 14A to 14C, the first bit line BL1 of the second contact region C2 and the third contact region C3 is slimmed by isotropic etching. After etching, the first mask layer 110 is removed by, for example, an asking method. The etching may be, for example, dry etching and may be etching using a chemical solution.

The width and height of the first bit line BL1 which is slimmed, that is, the first bit line BL1 which is etched, become smaller. Specifically, when the width of the first bit line BL1 in the second contact region C2 or the third contact region C3 is set as W3, and the height thereof is set as H3, W3 is smaller than W2, H3 is smaller than H2. In other words, in the first bit line BL1, the second portion BL1_2 and the third portion BL1_3 are slimmed relative to the first portion BL1_1. That is, the second portion BL1_2 and the third portion BL1_3 are formed to be smaller in width than the first portion BL1_1.

Meanwhile, the first bit line BL1 of the first contact region C1 is covered with the first mask layer 110 during etching. Thus, the first bit line BL1 of the first contact region C1 is not slimmed.

Meanwhile, as the first mask layer 110, a so-called hard mask such as a silicon oxide layer may be used. In this case, the entirety of the first mask layer may not be necessarily removed after etching.

As shown in FIGS. 15 and 16A to 16C, the third insulating layer 100c is formed on the first bit line BL1 and the second insulating layer 100b. The second bit line BL2 is formed on the third insulating layer 100c.

The third insulating layer 100c is, for example, a silicon oxide layer, and is formed by, for example, a CVD method.

In the contact region C, the second bit line BL2 has a width W4 and a height H4.

In the contact region C, the second bit line BL2 is formed so as to substantially overlap the first bit line BL1 before slimming. That is, in the contact region C, the width W4 of the second bit line BL2 is substantially the same as the width W2 of the first bit line BL1.

The second bit line BL2 is made of the same material as the material, for example, of the first bit line BL1. However, the material thereof is not necessarily required to be the same material as that of the first bit line BL1. A method of forming the second bit line BL2 is also based on, for example, the same method of forming the first bit line BL1.

Figure 17:
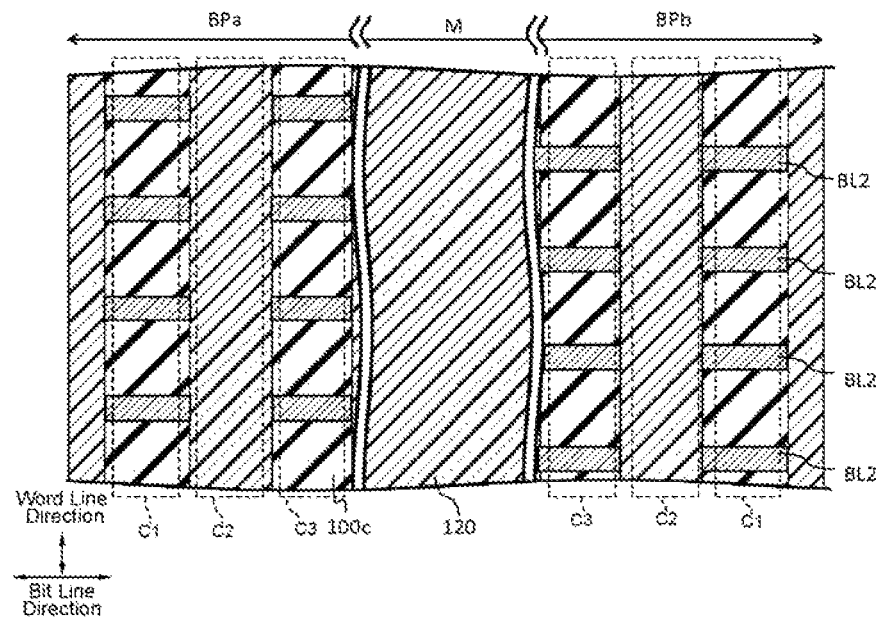
FIG. 17 is a schematic plan view illustrating a step of the method of manufacturing the memory device according to the first embodiment.
Figure 18:
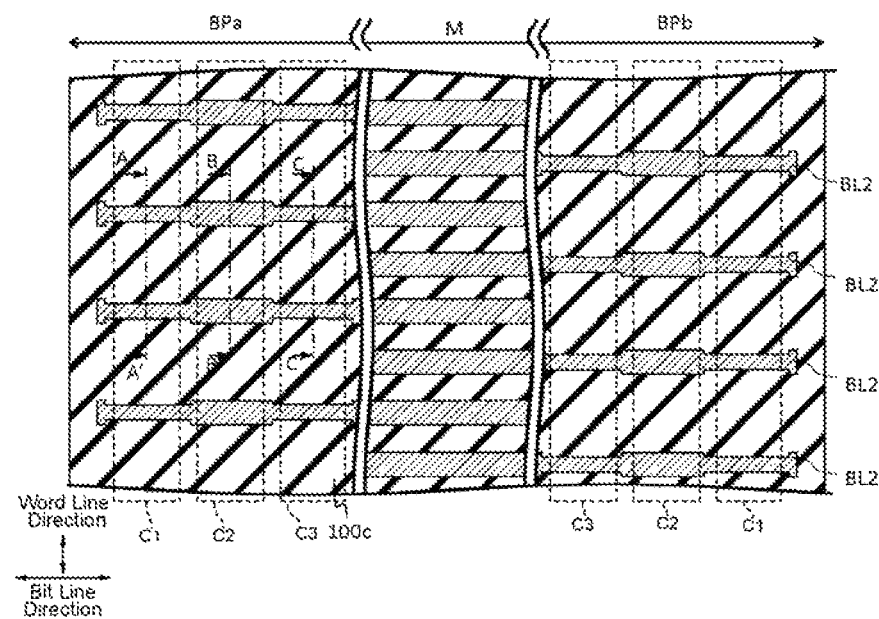
FIG. 18 is a schematic plan view illustrating a step of the method of manufacturing the memory device according to the first embodiment.
Figures 19A, 19B, 19C:
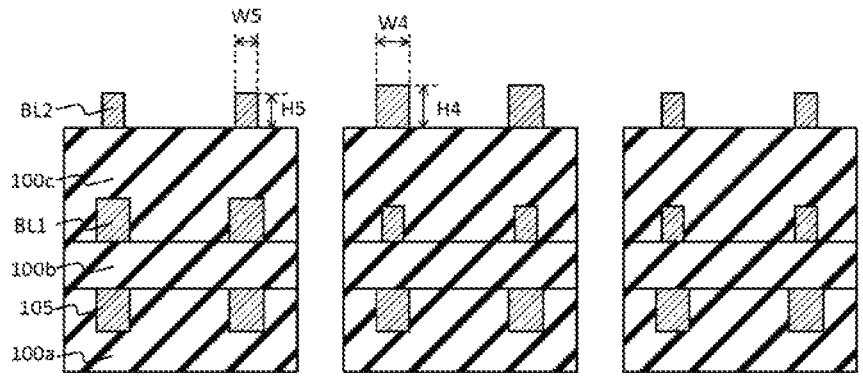
FIGS. 19A to 19C are schematic cross-sectional views illustrating a step of the method of manufacturing the memory device according to the first embodiment.
Figure 20:
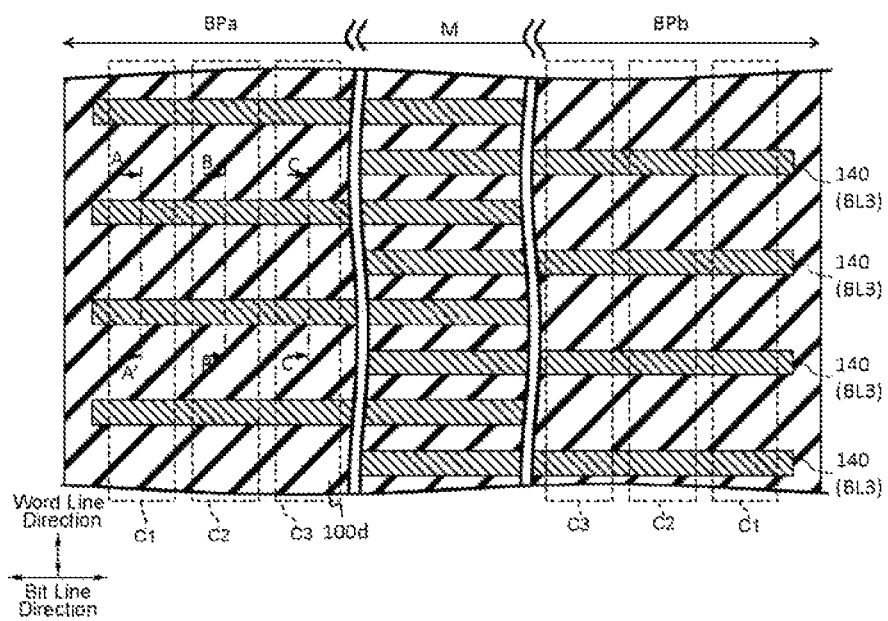
FIG. 20 is a schematic plan view illustrating a step of the method of manufacturing the memory device according to the first embodiment.
Figures 21A, 21B, 21C:
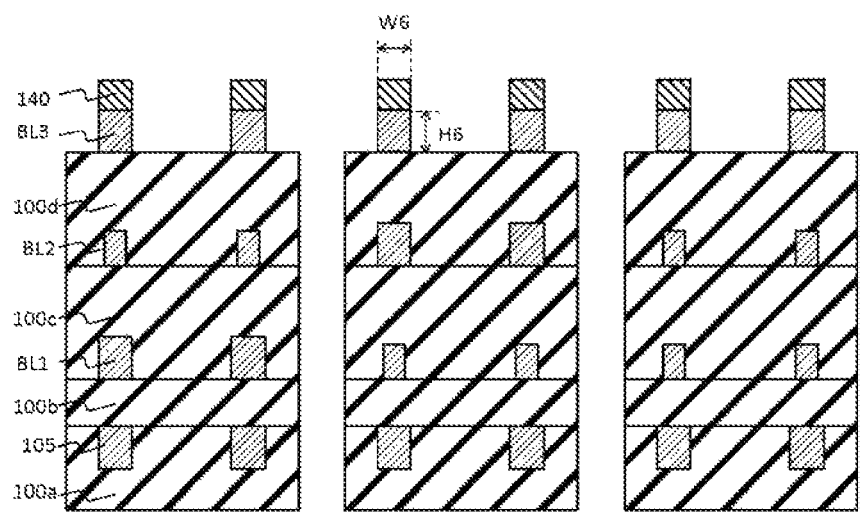
FIGS. 21A to 21C are schematic cross-sectional views illustrating a step of the method of manufacturing the memory device according to the first embodiment.

As shown in FIG. 17, the second mask layer 120 is formed on the second bit line BL2 and the third insulating layer 100c. The second mask layer 120 does not cover the first contact region C1 and the third contact region C3, and covers other regions. The second mask layer 120 covers, for example, the second contact region C2 and the memory portion M. The second mask layer 120 is formed by, for example, the material and manufacturing process of the first mask layer 110. However, the material and manufacturing process are not necessarily required to be the same material and manufacturing process as those of the first mask layer 110.

As shown in FIGS. 18 and 19A to 19C, the second bit line BL2 of the first contact region C1 and the third contact region C3 is slimmed by isotropic etching. After etching, the second mask layer 120 is removed by, for example, an asking method.

The width and height of the second bit line BL2 which is slimmed, that is, the second bit line BL2 which is etched, become smaller. Specifically, when the width of the second bit line BL2 in the first contact region C1 or the third contact region C3 is set as W5, and the height thereof is set as H5, W5 is smaller than W4, and H5 is smaller than H4. In other words, in the second bit line BL2, the fourth portion BL2_1 and the sixth portion BL2_3 are slimmed with respect to the fifth portion BL2_2. That is, the fourth portion BL2_1 and the sixth portion BL2_3 are formed to be smaller in width than the fifth portion BL2_2.

Meanwhile, the second bit line BL2 of the second contact region C2 is covered with the second mask layer 120 during etching. Thus, the second bit line BL2 of the second contact region C2 is not slimmed.

As shown in FIG. 20 and FIGS. 21A to 21C, the fourth insulating layer 100d is formed on the second bit line BL2 and the third insulating layer 100c. The third bit line BL3 and the cap layer 140 are formed on the third bit line BL3.

The fourth insulating layer 100d is, for example, a silicon oxide layer, and is formed by, for example, a CVD method.

In the contact region C, the third bit line BL3 has a width W6 and a height H6.

In the contact region C, the third bit line BL3 and cap layer 140 are formed so as to substantially overlap the first bit line BL1 and the second bit line BL2 before slimming. That is, in the contact region C, the width W6 is substantially the same as the widths W2 and W4.

The third bit line BL3 is made of the same material as the material, for example, of the first bit line BL1. However, the material thereof is not necessarily required to be the same material as that of the first bit line BL1.

The cap layer 140 includes a material different from that of the first insulating layer 100a, the second insulating layer 100b, the third insulating layer 100c, and the fourth insulating layer 100d. Specifically, the cap layer 140 includes, for example, a silicon nitride, silicon or the like. The cap layer 140 may be, for example, a stacked layer of a silicon nitride, silicon, and a silicon oxide. In addition, the material of the cap layer 140 is not necessarily limited to an insulating layer.

The third bit line BL3 and the cap layer 140 have, for example, a layer serving as a material formed therein, and then are formed by a lithography method and an RIE method.

Figure 22:
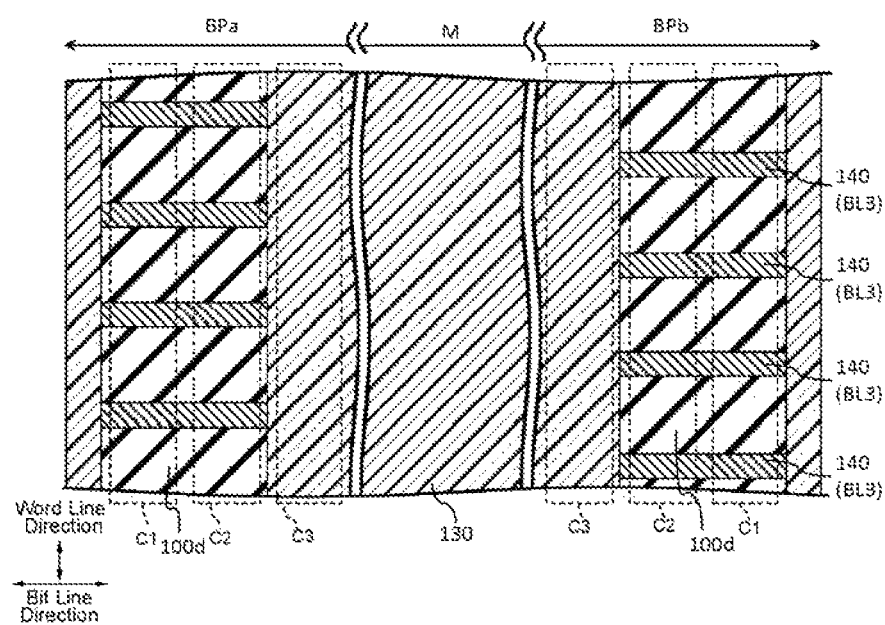
FIG. 22 is a schematic plan view illustrating a step of the method of manufacturing the memory device according to the first embodiment.
Figure 23:
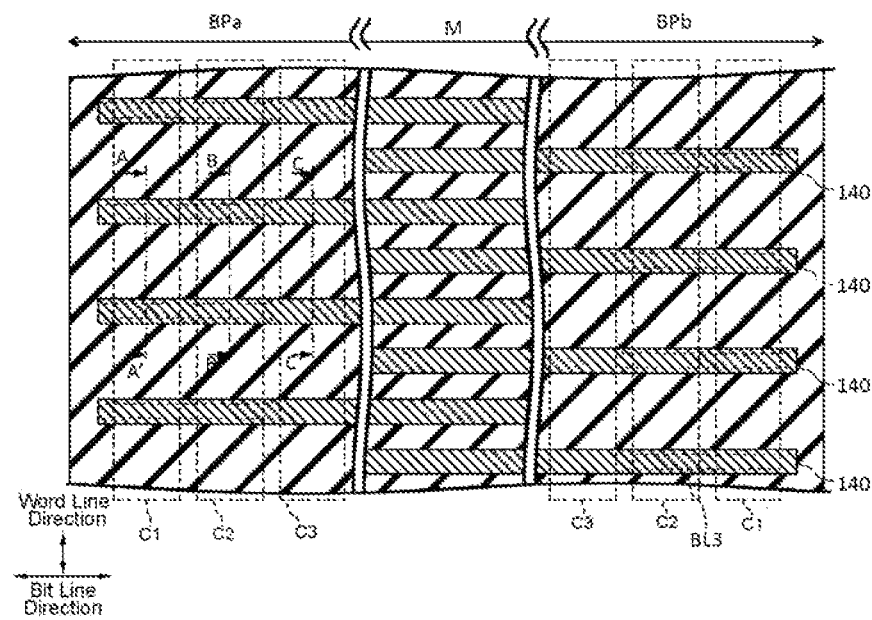
FIG. 23 is a schematic plan view illustrating a step of the method of manufacturing the memory device according to the first embodiment.
Figures 24A, 24B, 24C:
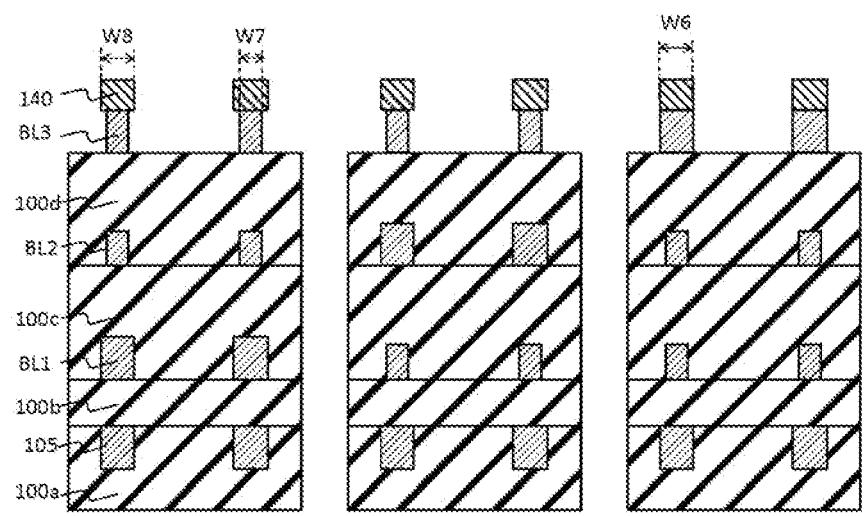
FIGS. 24A to 24C are schematic cross-sectional views illustrating a step of the method of manufacturing the memory device according to the first embodiment.

As shown in FIG. 22, the third mask layer 130 is formed on the cap layer 140 and the fourth insulating layer 100d. The third mask layer 130 does not cover the first contact region C1 and the second contact region C2, and covers other regions. The third mask layer 130 covers, for example, the third contact region C3 and the memory portion M. The third mask layer 130 is formed by, for example, the material and manufacturing process of the first mask layer 110. However, the material and manufacturing process are not necessarily required to be the same material and manufacturing process as those of the first mask layer 110.

As shown in FIG. 23 and FIGS. 24A to 24C, the third bit line BL3 of the first contact region C1 and the second contact region C2 is slimmed by isotropic etching. After etching, the third mask layer 130 is removed by, for example, an asking method.

The width of the third bit line BL3 which is slimmed, that is, the third bit line BL3 which is etched, becomes smaller. Specifically, when the width of the third bit line BL3 in the first contact region C1 or the second contact region C2 is set as W7, W7 is smaller than W6. In other words, in the third bit line BL3, the seventh portion BL3_1 and the eighth portion BL3_2 are slimmed relative to the ninth portion BL3_3. That is, the seventh portion BL3_1 and the eighth portion BL3_2 are formed to be smaller in width than the ninth portion BL3_3.

Meanwhile, since the cap layer 140 is provided on the third bit line BL3, the height of the third bit line BL3 in the first contact region C1 and the second contact region C2 does not change.

In addition, the third bit line BL3 of the third contact region C3 is covered with the third mask layer 130 during etching. Thus, the third bit line BL3 of the third contact region C3 is not slimmed.

As an etching condition of this etching, a condition in which the cap layer 140 is not likely to be etched is used. That is, in the first contact region C1 and the second contact region C2, the cap layer 140 is also not etched as compared to the third bit line BL3. That is, as shown in FIG. 24, in the first contact region C1 and the second contact region C2, when the width of the cap layer 140 is set as W8, W8 is larger than W7. In addition, the width W8 is substantially the same as the width W6, or may be smaller than that. Further, W8 is larger than W5 and W7.

Figures 25A, 25B, 25C:
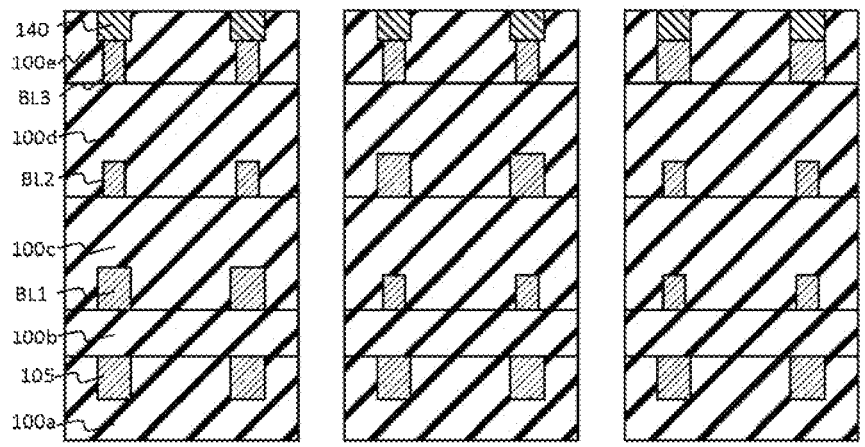
FIGS. 25A to 25C are schematic cross-sectional views illustrating a step of the method of manufacturing the memory device according to the first embodiment.

As shown in FIGS. 25A to 25C, the fifth insulating layer 100e is formed on the fourth insulating layer 100d. The fifth insulating layer 100e is, for example, a silicon oxide layer, and is formed by a CVD method. After the film formation, the fifth insulating layer 100e is planarized by, for example, CMP (Chemical Mechanical Polishing) using the cap layer 140 as a stopper layer.

Figure 26:
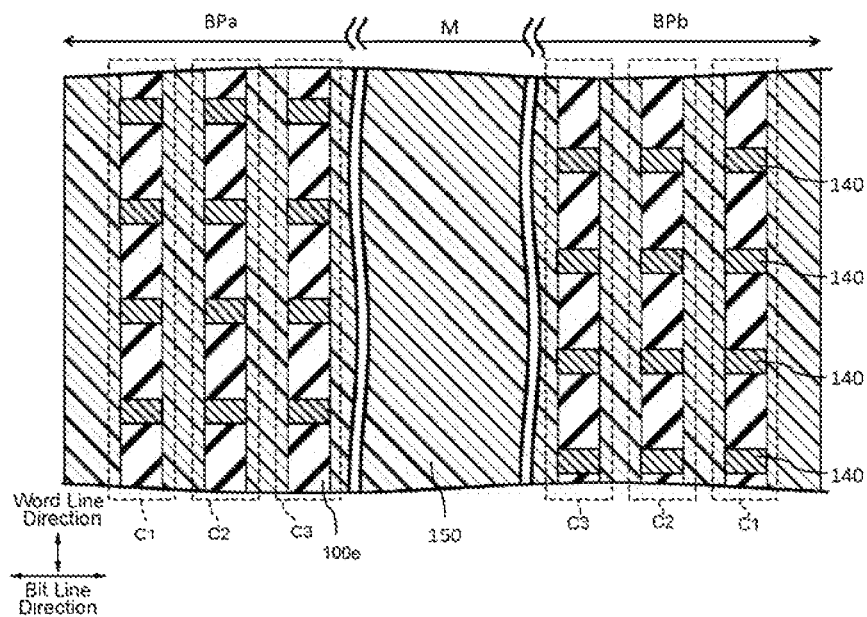
FIG. 26 is a schematic plan view illustrating a step of the method of manufacturing the memory device according to the first embodiment.
Figure 27:
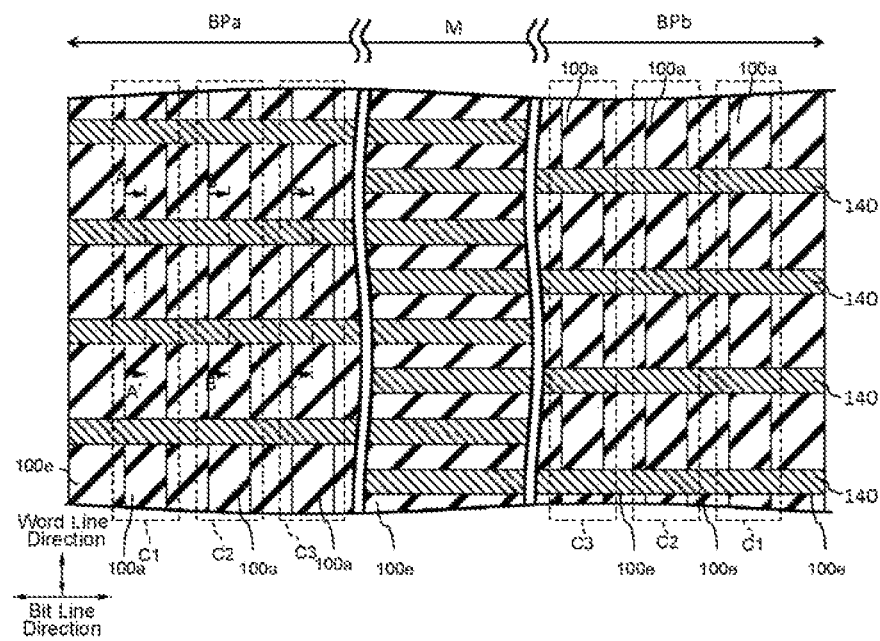
FIG. 27 is a schematic plan view illustrating a step of the method of manufacturing the memory device according to the first embodiment.
Figures 28A, 28B, 28C:
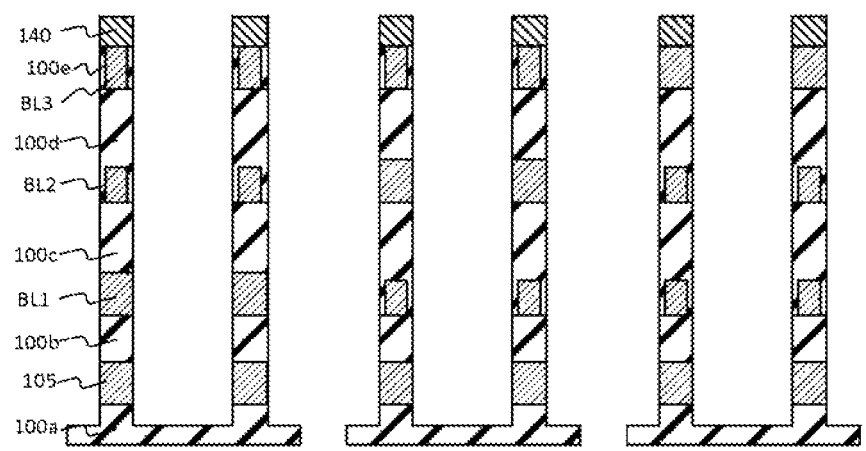
FIGS. 28A to 28C is a schematic cross-sectional views illustrating a step of the method of manufacturing the memory device according to the first embodiment.

As shown in FIG. 26, a fourth mask layer 150 is formed on the fifth insulating layer 100e. The fourth mask layer 150 does not cover the first contact region C1, the second contact region C2, and the third contact region C3, and covers other portions, for example, the memory portion M. In other words, the fourth mask layer 150 is formed to have an opening in a line shape in the first contact region C1, the second contact region C2, and the third contact region C3.

The fourth mask layer 150 is formed by, for example, the material and manufacturing process of the first mask layer 110. However, the material and manufacturing process are not necessarily required to be the same material and manufacturing process as those of the first mask layer 110.

As shown in FIGS. 27 and 28A to 28C, the fifth insulating layer 100e, the fourth insulating layer 100d, the third insulating layer 100c, the second insulating layer 100b, and the first insulating layer 100a are etched in a line shape by anisotropic etching using the fourth mask layer 150 of FIG. 26 as a mask. After etching, the fourth mask layer 150 is removed.

This etching is performed in a condition in which the cap layer 140 is not likely to be etched. That is, the cap layer 140 functions as a mask material. The cap layer 140, and the fifth insulating layer 100e, the fourth insulating layer 100d, the third insulating layer 100c, the second insulating layer 100b, and the first insulating layer 100a which are regions overlapping the cap layer 140 as viewed from above are substantially not etched. Meanwhile, since slight side etching is generated even in anisotropic etching, there is the possibility of an insulating layer directly below the cap layer 140 being etched slightly.

In the first contact region C1, the lateral side of the first bit line BL1 is exposed by this etching. In the second contact region C2, the lateral side of the second bit line BL2 is exposed. In the third contact region C3, the lateral side of the third bit line BL3 is exposed.

In other words, in the first contact region C1, the fourth insulating layer 100d or the fifth insulating layer 100e is provided on each lateral side of the second bit line BL2 and the third bit line BL3. Similarly, in the second contact region C2, the third insulating layer 100c and the fifth insulating layer 100e are provided on the lateral sides of the first bit line BL1 and the third bit line BL3. In the third contact region C3, the third insulating layer 100c and the fourth insulating layer 100d are provided on the lateral sides of the first bit line BL1 and the second bit line BL2.

Figures 29A, 29B, 29C:
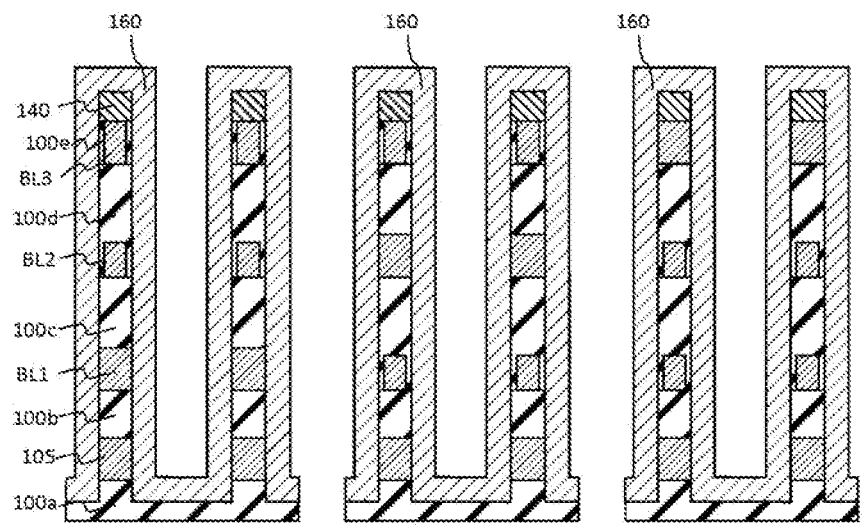
FIGS. 29A to 29C are schematic cross-sectional views illustrating a step of the method of manufacturing the memory device according to the first embodiment.

As shown in FIGS. 29A to 29C, a contact material 160 is formed. The contact material may be a conductive material. The contact material 160 includes, for example, a metal layer and a barrier metal layer. The metal layer includes copper, aluminum, or tungsten. The barrier metal layer includes titanium, tantalum, a titanium nitride, a tantalum nitride, or a stacked layer thereof. The contact material 160 may include, for example, impurity-doped silicon instead of the metal layer and the barrier metal layer.

As shown in FIGS. 30 and 31A to 31C, the contact material 160 is etched. The contact material 160 left on the sidewall of the bit line BL is referred to as the bit line contact 165.

Figure 32:
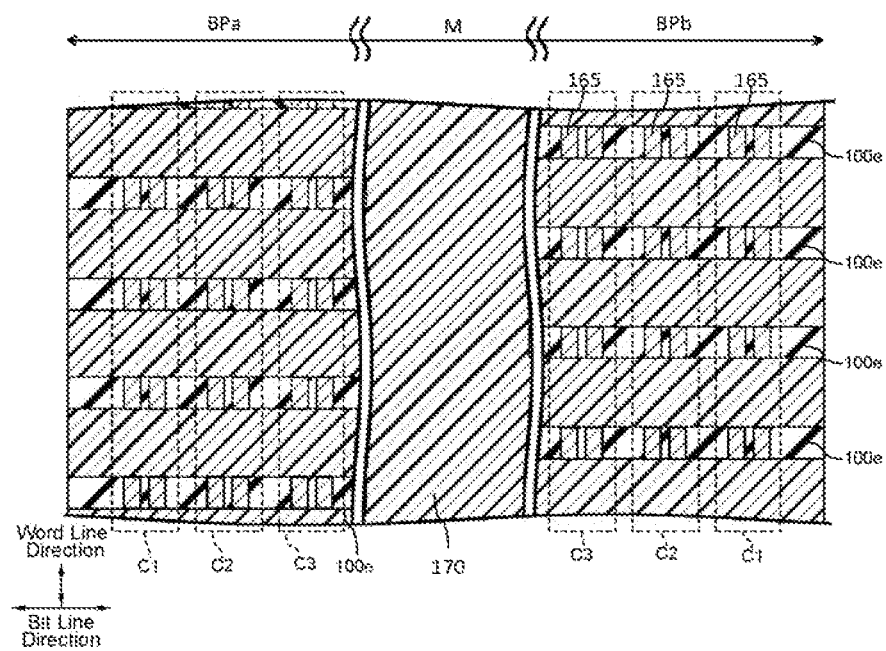
FIG. 32 is a schematic plan view illustrating a step of the method of manufacturing the memory device according to the first embodiment.

As shown in FIG. 32, a fifth mask layer 170 is formed. In the bit line contact region BPa or BPb, the fifth mask layer 170 has an opening extending in the bit line direction between bit lines adjacent to each other.

Figure 33:
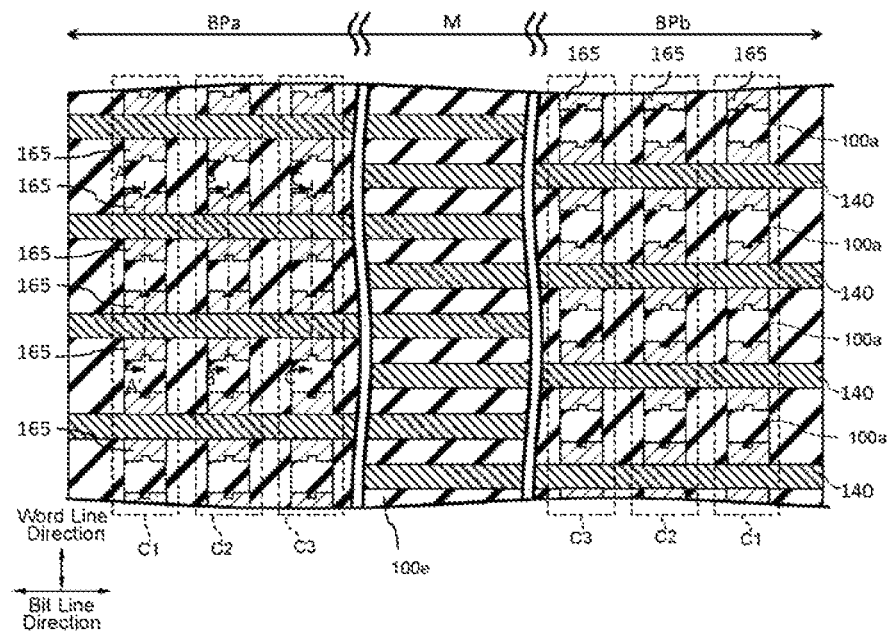
FIG. 33 is a schematic plan view illustrating a step of the method of manufacturing the memory device according to the first embodiment.

As shown in FIG. 33, the bit line contact 165 is etched using the fifth mask layer 170 as a mask. After etching, the fifth mask layer 170 is removed by, for example, an asking method. That is, the bit line contact 165 is separated between bit lines next to each other.

Figures 34A, 34B, 34C:
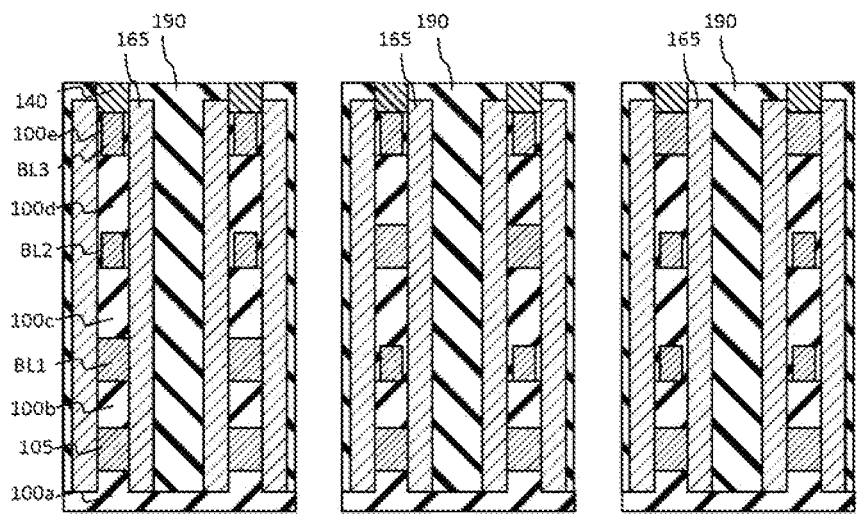
FIGS. 34A to 34C are schematic cross-sectional views illustrating a step of the method of manufacturing the memory device according to the first embodiment.

As shown in FIGS. 34A to 34C, a sixth insulating layer 190 is formed. The sixth insulating layer 190 is, for example, a silicon oxide layer, and is formed by a CVD method. After the film formation, the sixth insulating layer 190 is planarized by, for example, CMP using the cap layer 140 as a stopper layer.

Effect of First Embodiment

According to the present embodiment, it is possible to dispose the first bit line BL1, the second bit line BL2, and the third bit line BL3 so as to substantially overlap each other, and to form the bit line contact 165 on the lateral sides thereof. The bit line contact 165 may be arranged on the lateral side of the bit line BL, and thus the bit line BL is not required to provide an extra pattern for forming the bit line contact 165. Thus, the bit line is not required to provide a branched drawing pattern. Since the drawing pattern is not required to be provided, it is possible to reduce the area of the memory device. In other words, the bit line may not have a branch. Further, in other words, the bit line may not have a point of intersection at which three or more portions intersect each other. Further, In other words, the bit line may not have a portion extending in a direction intersecting the extending direction.

Further, according to the present embodiment, the bit line contact 165 is arranged on both lateral sides of the bit line BL. That is, one bit line BL and the lower-layer wiring 105 are electrically connected to each other through two bit line contacts 165. Two bit line contacts 165 are arranged, and thus it is possible to reduce electrical resistance between the bit line BL and the lower-layer wiring 105.

Further, according to the present embodiment, in the formation of the first bit line BL1, the second bit line BL2, and the third bit line BL3, substantially the same mask pattern may be used. That is, in the formation of the first bit line BL1, the second bit line BL2, and the third bit line BL3, a portion of a mask in a lithography method may be used in common. It is difficult to correct for the difference between the mask as designed and the real mask because of lithography process or RIE process. According to the present embodiment, since a portion of the mask may be used in common, it is possible to save the cost and time relevant to the mask design. That is, it is possible to provide a low-cost memory device.

Further, according to the present embodiment, as shown in FIG. 26, the mask pattern (fourth mask layer 150) of lithography during the formation of the bit line contact may be formed in a line shape. Further, after an insulating film is etched, the bit line contact 165 is formed by film formation and etch-back, and thus it is possible to reduce misalignment between the bit line contact 165 and the bit line BL. This is very important to a reduction in the size of the memory device.

Modification Example of First Embodiment

In the present embodiment, in the bit line contact regions BPa and BPb, the third contact region C3, the second contact region C2, and the first contact region C1 are arranged from a region close to the memory portion M. The order of the arrangement of the contact regions C may be arbitrary. In addition, each of the contact regions C may be arranged at a distant position.

In the present embodiment, the bit line contact 165 is also arranged on the lateral side of the cap layer 140, but this is not necessarily required. That is, the bit line contact 165 may come into contact with the lateral sides of the third bit line BL3, the second bit line BL2, the first bit line BL1, and the lower-layer wiring 105, but not the cap layer 140.

In addition, another modification example will be described below. In the above-mentioned description and drawings, the widths of the bit lines BL in the memory portion M and the bit line contact regions BPa and BPb are substantially the same, but there is no limitation thereto. For example, the width of the bit line BL in the bit line contact regions BPa and BPb may be smaller or larger than the width of the bit line BL in the memory portion M. Specifically, for example, when the width of the bit line BL in the memory portion M is 10 nm, the width of the bit line BL in the bit line contact regions BPa and BPb may be, for example, 20 nm. In addition, to the contrary, the width of the bit line BL in the bit line contact regions BPa and BPb may be, for example, 5 nm.

Figure 35:
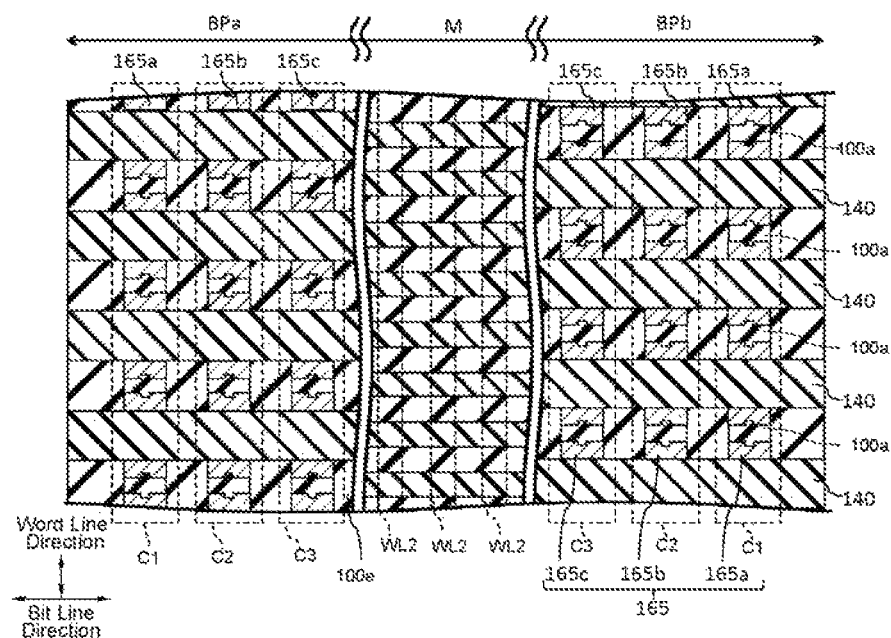
FIG. 35 is a schematic plan view of a memory portion and bit line contact regions of a memory device according to a modification example of the first embodiment.

FIG. 35 is a schematic diagram when the width of the bit line BL in the bit line contact regions BPa and BPb is made to be large, as an example of the modification example.

In the bit line contact regions BPa and BPb, when the width of the bit line BL is large, it is possible to reduce the resistance of the bit line BL. Further, the formation of the bit line BL by lithography and etching is facilitated. On the other hand, when the width of the bit line BL is small, it is possible to reduce the size of the memory device. That is, it is possible to provide a low-cost memory device. For example, the width of the bit line BL is made to be small, and thus the bit line contact region may be formed as only one side, for example, only the bit line contact region BPa.

Second Embodiment

Figures 36A, 36B, 36C:
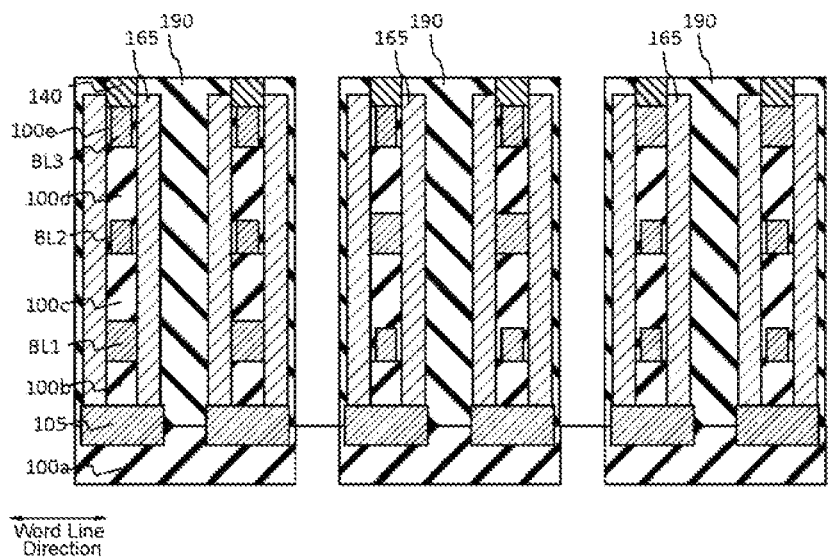
FIGS. 36A to 36C are schematic cross-sectional views of bit line contacts of a memory device according to a second embodiment.

FIGS. 36A to 36C show a second embodiment.

The second embodiment is different from the first embodiment, in that the lower-layer wiring 105 is larger in width than the bit line BL, and that the bit line contact 165 comes into contact with the upper surface of the lower-layer wiring 105.

In the second embodiment, it is also possible to obtain the same operational effect as that in the first embodiment.

Further, in the second embodiment, the fifth insulating layer 100e, the fourth insulating layer 100d, the third insulating layer 100c, the second insulating layer 100b, and the first insulating layer 100a described in FIGS. 27 and 28A to 28C of the first embodiment are easily etched by RIE. For example, it is possible to perform end point detection of RIE at a point in time when the lower-layer wiring 105 is exposed. Alternatively, the etching rates of the lower-layer wiring 105 and the insulating layer are different from each other, and thus the control of RIE is facilitated.

Third Embodiment

Figure 37:
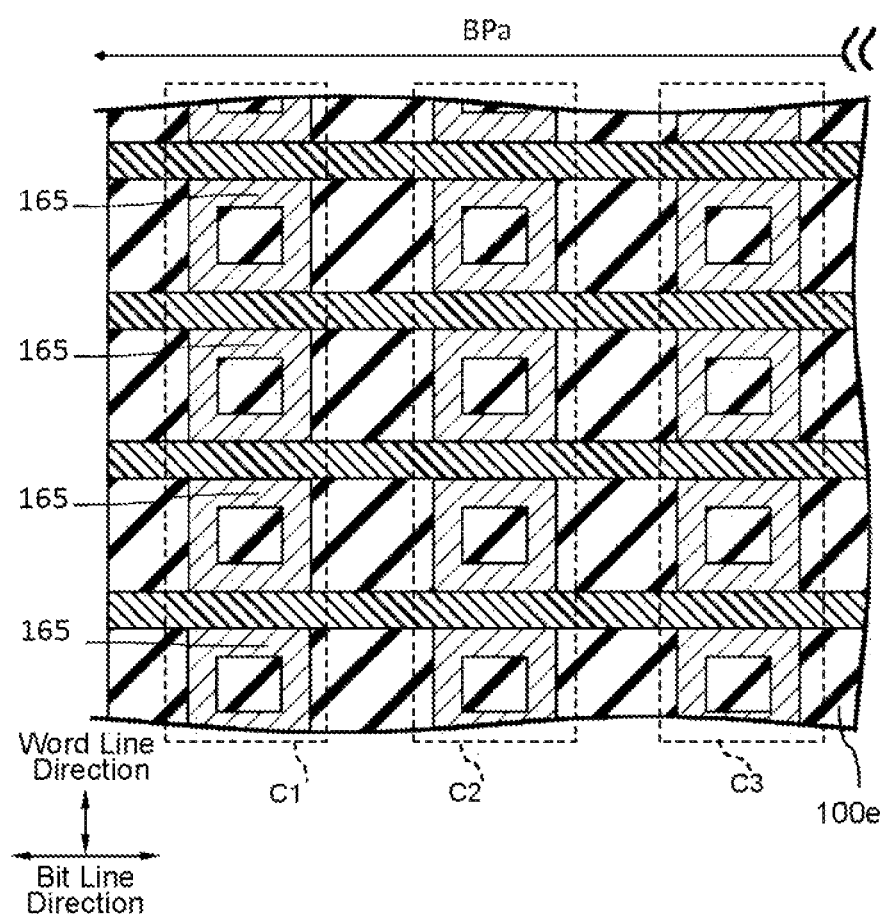
FIG. 37 is a schematic plan view illustrating a step of a method of manufacturing a memory device according to a third embodiment.
Figure 38:
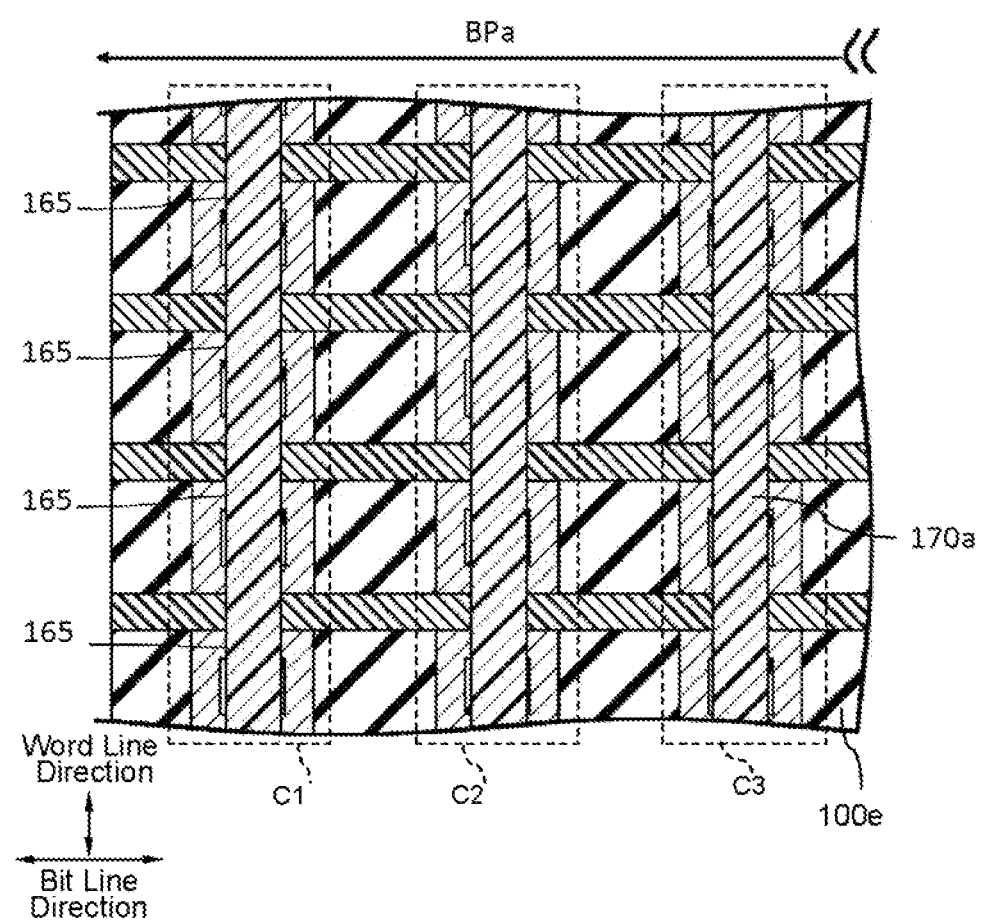
FIG. 38 is a schematic plan view illustrating a step of the method of manufacturing the memory device according to the third embodiment.
Figure 39:
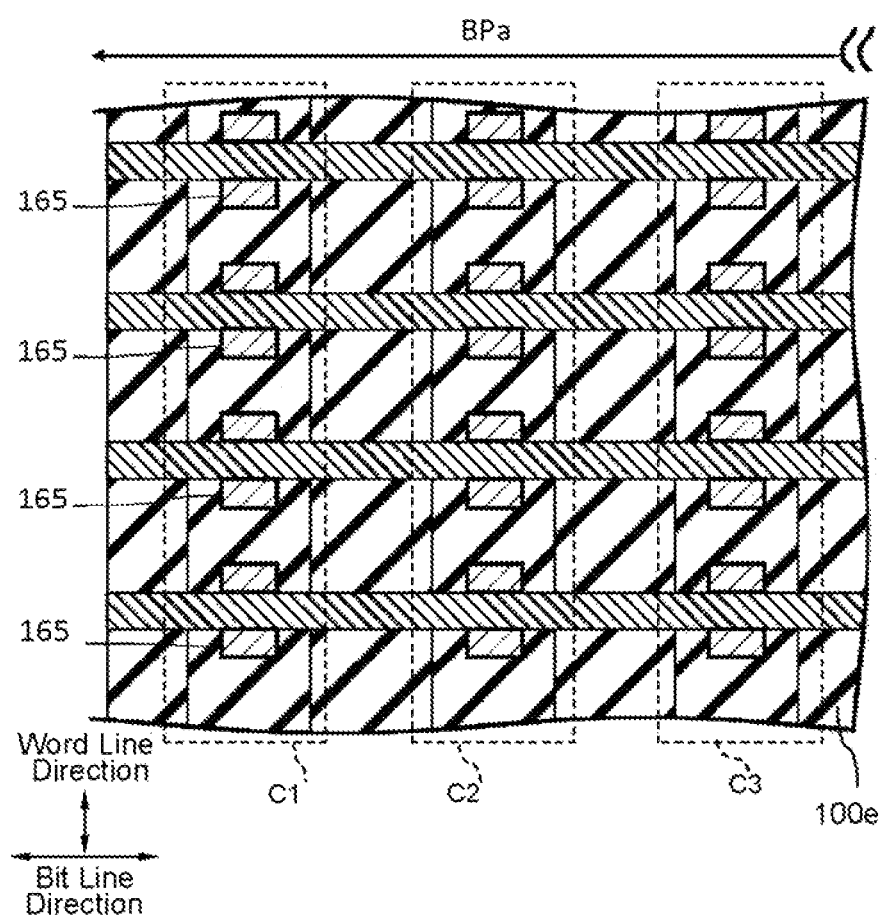
FIG. 39 is a schematic plan view illustrating a step of the method of manufacturing the memory device according to the third embodiment.

FIGS. 37 to 39 show a third embodiment.

The third embodiment is different from the first embodiment in the layout of the fifth mask layer 170 shown in FIG. 32.

Figure 30:
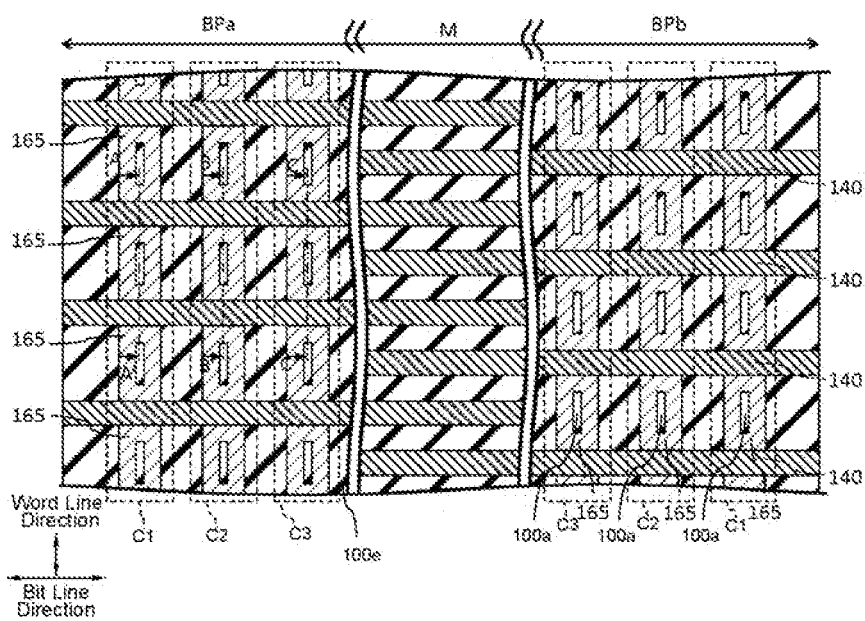
FIG. 30 is a schematic plan view illustrating a step of the method of manufacturing the memory device according to the first embodiment.
Figures 31A, 31B, 31C:
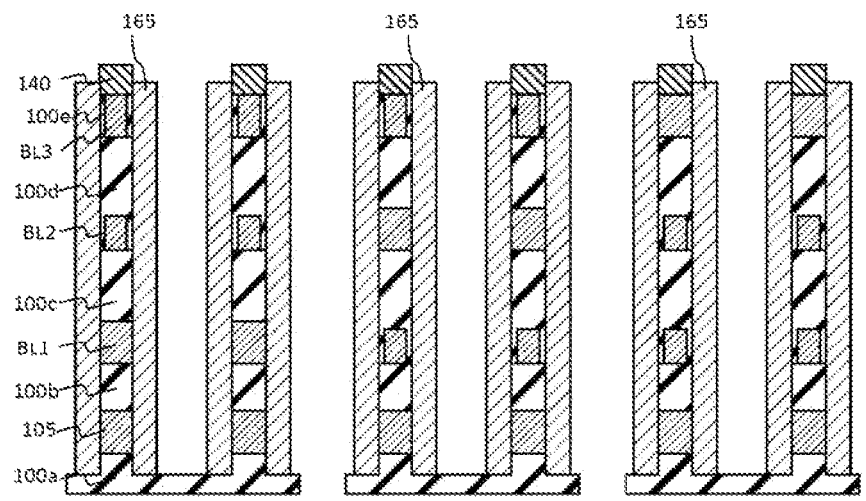
FIGS. 31A to 31C are schematic cross-sectional views illustrating a step of the method of manufacturing the memory device according to the first embodiment.

First, FIG. 37 shows a drawing equivalent to FIG. 30 of the first embodiment. FIG. 37 shows the bit line contact region BPa of FIG. 30, and aspect ratios and the like are different from each other.

As shown in FIG. 38, a fifth mask layer 170a is formed by opening a region (region extending in the word line direction) of the bit line contact 165 extending between bit lines adjacent to each other. Meanwhile, FIG. 38 shows an example in which the fifth mask layer 170a is formed in a line shape in the word line direction, but there is no limitation thereto. For example, the fifth mask layer 170a may be formed on the fifth insulating layer 100e in a line shape.

As shown in FIG. 39, a region of the bit line contact 165 extending in the word line direction is removed by etching. Thereby, the bit line contact 165 is formed.

In the present embodiment, unlike the first embodiment, the fifth mask layer 170 may be provided in a line shape in the word line direction, which leads to the facilitation of manufacturing. Further, periodic formation in a line shape may be made depending on the layout of the fifth mask layer 170, which leads to the further facilitation of manufacturing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a substrate;
   a first contact extending in a first direction that crosses a surface of the substrate;
   a second contact extending in the first direction, the first and second contacts being aligned in a second direction along the surface of the substrate;
   a first conductive layer above the substrate and extending in a third direction that is along the surface of the substrate and crosses the second direction, the first conductive layer being formed between the first contact and the second contact in the second direction, and electrically connected to and in direct contact with the first contact and the second contact;
   a second conductive layer above the first conductive layer in the first direction and extending in the third direction, the second conductive layer being formed between the first contact and the second contact in the second direction, and electrically insulated and physical separated from the first contact and the second contact.

2. The device according to claim 1, further comprising:
   a third conductive layer above the second conductive layer in the first direction and extending in the third direction, the third conductive layer being formed between the first contact and the second contact, and electrically insulated and physical separated from the first contact and the second contact.

3. The device according to claim 2, wherein widths of portions of the second and third conductive layers that are positioned between the first contact and the second contact in the second direction are less than a width of a portion of the first conductive layer that is positioned between the first contact and the second contact in the second direction.

4. The device according to claim 1, further comprising:
   a fourth conductive layer between the substrate and the first conductive layer and electrically connected to the first conductive layer through the pair of first and second contacts.

5. The device according to claim 4, wherein widths of a portion of the first conductive layer and a portion of the fourth conductive layer that are positioned between the first contact and the second contact in the second direction are substantially the same.

6. The device according to claim 4, wherein a width of a portion of the first conductive layer that is positioned between the first contact and the second contact in the second direction is less than a width of a portion of the fourth conductive layer that is positioned between the first contact and the second contact in the second direction.

7. The device according to claim 1, wherein the first contact is in direct contact with a first lateral side of a portion of the first conductive layer and the second contact is in direct contact with a second lateral side of the portion of the first conductive layer that is opposite from the first lateral side.

8. The device according to claim 1, wherein
   the first conductive layer is electrically connected to a first memory cell, and
   the second conductive layer is electrically connected to a second memory cell.

9. The device according to claim 8, wherein
   the second memory cell is located above the first memory cell and the first and second memory cells are aligned in the first direction.

10. A memory device comprising:
    a substrate;
    a first contact extending in a first direction that crosses a surface of the substrate;
    a second contact extending in the first direction, the first and second contacts being aligned in a second direction along the surface of the substrate;
    a third contact extending in the first direction, the first and third contacts being aligned in a third direction that is along the surface of the substrate and crosses the second direction;
    a fourth contact extending in the first direction, the second and fourth contacts being aligned in the third direction, and the third and fourth contact being aligned in the second direction;
    a first conductive layer above the substrate and extending in a third direction, wherein the first conductive layer is formed between the first contact and the second contact and between the third contact and the fourth contact, electrically connected to and in direct contact with the first and second contacts, and electrically insulated and physical separated from the third contact and the fourth contact;
    a second conductive layer above the first conductive layer in the first direction and extending in the third direction, wherein the second conductive layer is formed between the first contact and the second contact and between the third contact and the fourth contact, electrically insulated and physically separated from the first and second contacts, and electrically connected to and in direct contact with the third and fourth contacts.

11. The device according to claim 10, further comprising:
a third conductive layer above the second conductive layer in the first direction and extending in the third direction, wherein the third conductive layer is formed between the first contact and the second contact and between the third contact and the fourth contact, and electrically insulated and physical separated from the first, second, third, and fourth contacts.

12. The device according to claim 11, further comprising:
a fourth conductive layer between the substrate and the first conductive layer and electrically connected to the first conductive layer through the first and second contacts and electrically connected to the second conductive layer through the third and fourth contacts.

13. The device according to claim 10, wherein widths of the first and second conductive layers in the second direction vary along the third direction.

14. The device according to claim 13, wherein the width of a portion of the first conductive layer between the first contact and the second contact and the width of a portion of the second conductive layer between the third contact and the fourth contact are substantially the same.

15. The device according to claim 10, wherein the first contact is in direct contact with a first lateral side of the first conductive layer and the second contact is in direct contact with a second lateral side of the first conductive layer that is opposite from the first lateral side of the first conductive layer, and the third contact is in direct contact with a first lateral side of the second conductive layer and the fourth contact is in direct contact with a second lateral side of the second conductive layer that is opposite from the first lateral side of the second conductive layer.

16. The device according to claim 10, wherein
the first conductive layer is electrically connected to a first memory cell, and
the second conductive layer is electrically connected to a second memory cell.

17. The device according to claim 16, wherein
the second memory cell is located above the first memory cell and the first and second memory cells are aligned in the first direction.

18. The device according to claim 1, further comprising:
an insulating layer formed between the first contact and the second conductive layer and between the second contact and the second conductive layer.

19. The device according to claim 10, further comprising:
an insulating layer formed between the first contact and the second conductive layer and between the second contact and the second conductive layer.

* * * * *